(12) United States Patent
Hirasawa et al.

(10) Patent No.: US 7,314,522 B2
(45) Date of Patent: Jan. 1, 2008

(54) APPARATUS AND METHOD FOR PRODUCING SINGLE CRYSTAL

(75) Inventors: Shigeki Hirasawa, Tokyo (JP); Masato Ikegawa, Tokyo (JP); Hiroyuki Ishibashi, Hitachinaka (JP); Akihiro Gunji, Hitachinaka (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 270 days.

(21) Appl. No.: 10/517,527

(22) PCT Filed: Jun. 12, 2003

(86) PCT No.: PCT/JP03/07493

§ 371 (c)(1),
(2), (4) Date: Dec. 13, 2004

(65) Prior Publication Data

US 2005/0217570 A1    Oct. 6, 2005

(30) Foreign Application Priority Data

Jun. 13, 2002  (JP) .............................. 2002-172701
Aug. 8, 2002   (JP) .............................. 2002-231034
May 28, 2003   (JP) .............................. 2003-150713

(51) Int. Cl.
*C30B 35/00* (2006.01)

(52) U.S. Cl. .................... 117/217; 117/13; 117/218; 117/222

(58) Field of Classification Search ................. 117/13, 117/217, 218, 222

See application file for complete search history.

(56) References Cited

U.S. PATENT DOCUMENTS 6,099,641 A * 8/2000 Ikeda ......................... 117/217
6,482,263 B1 * 11/2002 Ferry et al. ................. 117/217

* cited by examiner

*Primary Examiner*—Felisa Hiteshew
(74) *Attorney, Agent, or Firm*—Antonelli, Terry, Stout & Kraus, LLP.

(57) ABSTRACT

An apparatus having a crucible (1) for holding a raw material, a heating means (11) for heating the raw material in the crucible (1) and a crystal transporting means (17) for transporting a seed crystal (13) upwards from the inside of the crucible (1), which further comprises a heat conducting member (3) which extends upwards at least from the vicinity of the upper end of the crucible (1), surrounds a single crystal (15) formed, and is made of a material having heat conductivity, and an interface portion radiation heat blocking member (7) for blocking, at least during cooling after the formation of a single crystal, the radiation heat toward an upper portion above the interface between a taper portion (15a) of the formed single crystal (15) connecting with the seed crystal (13) and a straight bulge portion (15b) having a cylindrical shape connecting with the taper portion (15a) of the formed single crystal (15). The use of the apparatus reduces the temperature difference in the radius direction of the single crystal (15), resulting in the reduction of the occurrence of defects or cracks, which leads to the reduction of the fraction defective in production of single crystals.

16 Claims, 19 Drawing Sheets

US 7,314,522 B2

APPARATUS AND METHOD FOR PRODUCING SINGLE CRYSTAL

This application is a 371 of PCT/JP03/07493 Jun. 12, 2003

TECHNICAL FIELD

The present invention relates to a technology of producing a single crystal used for electronic equipments, medical apparatuses, and the like.

BACKGROUND ART

In a known technology of producing a single crystal, a seed crystal is brought into contact with a melt of a heated raw material, and this seed crystal is pulled up, so that a single crystal is produced. In general, the formation of the single crystal is performed by the following procedure. A crucible holding a raw material of a single crystal and provided with a surrounding heating device is disposed in the inside of a furnace, the crucible is heated by the above-described heating device, and a melt of the raw material is heated by the crucible heated to a high temperature. When a seed crystal having a diameter smaller than the diameter of the single crystal to be produced is brought into contact with the surface of this melt, the melt brought into contact with the seed crystal dissipates heat through the seed crystal and is cooled, so that a crystal grows while being aligned in the direction of the crystal of the seed crystal. The seed crystal is pulled up in accordance with the growth of the crystal, the grown crystal is cooled sequentially and, therefore, the crystal further grows. This is repeated, and the single crystal is produced. In the initial stage of growth of the single crystal, in order to increase the diameter of the crystal, a taper portion having a diameter becoming conically increased from the seed crystal is formed while the seed crystal is pulled up. When the diameter of the seed crystal reaches a predetermined size, the formation of the taper portion having a diameter becoming gradually increased is terminated, and the formation of the straight body portion is started, wherein the crystal grows cylindrically in the axis direction.

At this time, since the liquid level of the melt is positioned below the upper end of the crucible, the single crystal being pulled up is heated by application of the radiation heat from the inner perimeter of the crucible while the crystal is positioned below the upper end of the crucible, and a portion of the single crystal positioned higher than the upper end of the crucible dissipates heat and is cooled. After an adequate length of straight body portion is formed, the straight body portion is isolated from the melt, and the amount of heating of the crucible is reduced gradually and the crucible is cooled to room temperature.

In such a technology of producing a single crystal, when defects, cracks, and the like occur, portions including the defects, cracks, and the like become defective portions, so that no product is available. Therefore, it is necessary for an improvement of the productivity to reduce the occurrence rate of defective portions, i.e. the fraction defective. One of the causes of occurrence of defects, cracks, and the like in the single crystal is attributed to a temperature distribution in the single crystal during the formation of the single crystal and during the cooling of the formed single crystal.

With respect to a technology of producing a single crystal to appropriately adjust such a temperature distribution, i.e. temperature gradient, in the single crystal in a longitudinal direction during the formation of the single crystal and during the cooling of the single crystal, Japanese Unexamined Patent Application Publication No. 8-175896 proposes that a radiation heat reflector is disposed above a single crystal so as to suppress the heat dissipation toward an upper portion above the single crystal, and the radiation heat reflector is moved upward as the single crystal is pulled up. Japanese Unexamined Patent Application Publication No. 6-157187 proposes that a movable refractory lid is disposed on the upper opening of a furnace containing a crucible for producing a single crystal. In addition, Japanese Unexamined Patent Application Publication No. 2001-316195 proposes that a lid is disposed on the upper portion of a crucible for producing a single crystal.

On the other hand, natural convection caused by a density gradient resulting from a temperature gradient of a melt in a crucible, Marangoni convection caused by a surface tension gradient, and the like occur in the melt in the crucible. When these types of convection of the melt occur, a portion at which the single crystal is formed, i.e. a solid-liquid interface portion of the single crystal, does not become flat, but becomes concave or convex, for example. Consequently, a temperature distribution in the radius direction in the vicinity of the solid-liquid interface portion of the single crystal becomes nonuniform. With respect to a technology of producing a single crystal to reduce such nonuniformity of the temperature distribution in the vicinity of the solid-liquid interface portion of the single crystal, Japanese Unexamined Patent Application Publication No. 6-183877 proposes that when a single crystal is pulled up, the single crystal is rotated or a cylindrical crucible is rotated in a rotational axis which is a central axis of a cylindrical crucible, forced convection to spread the melt in the radius direction of the crucible is effected and, thereby, a convection pattern of the entire melt is controlled in order to flatten the shape of the solid-liquid interface portion of the single crystal.

In Japanese Unexamined Patent Application Publication No. 8-175896, a temperature distribution in the single crystal in a longitudinal direction is reduced in the process of forming the single crystal in order to reduce the occurrence of defects, cracks, and the like. However, when a radiation heat reflector is disposed at the position immediately above the single crystal, the difference in the temperature distribution in the single crystal in the radius direction during cooling is increased and, therefore, it is difficult to reduce the occurrence of defects, cracks, and the like. In Japanese Unexamined Patent Application Publication No. 6-157187, the lid is disposed on the upper portion of refractory in a cooling process in order to reduce the cooling rate and to reduce the temperature distribution in the single crystal and, thereby, to reduce the occurrence of defects, cracks, and the like. However, the control of the surface temperature of the single crystal in the process of forming the single crystal is not taken into consideration, so that the temperature distribution cannot be made appropriate in the process of forming the single crystal, and it is difficult to reduce the occurrence of defects, cracks, and the like as well.

In Japanese Unexamined Patent Application Publication No. 2001-316195, since the lid is disposed on the upper portion of the crucible, the surface temperature of the single crystal in an upper portion above the crucible cannot be controlled in the cooling process, the temperature distribution cannot be made appropriate in the process of forming the single crystal as well, and it is difficult to reduce the occurrence of defects and cracks. In addition, since the lid is disposed on the upper portion of the crucible in the initial stage of the process of forming the single crystal as well, the temperature of the surface of the taper portion of the single crystal, i.e. the taper surface, is raised, the surface is roughened and, contrary to expectations, defects, cracks, and the like may tend to occur. Consequently, these technologies of producing a single crystal may not reduce the occurrence of defects, cracks, and the like, and it is difficult to reduce the fraction defective.

On the other hand, in high-frequency induction heating by the use of a high-frequency generation device including a high-frequency coil as a heating device, the heating value per unit volume in a unit time is proportional to the square of the current $J_\theta$ in the circumferential direction, the current being induced on the surface of the metal. The $J_\theta$ increases as the metal is located closer to the coil. The electromagnetic field has a property of concentrating on the surface of the corner portion of the metal. Therefore, when the cylindrical crucible is heated by the high-frequency induction heating, the electromagnetic field concentrates on the upper end portion of the side wall of the crucible and the periphery of the bottom serving as the lower end portion. Consequently, the heating values at the upper end portion and the lower end portion of the side wall of the crucible become larger than those of other portions. In this manner, for example, as the side wall becomes longer in the axis direction than the diameter of the bottom, the temperatures of the portions of the side wall other than the upper end portion and the lower end portion of the side wall of the crucible become lower than the temperatures of the upper end portion and the lower end portion. Therefore, the temperature distribution of the crucible becomes nonuniform, and the melt exhibits an undesirable convection pattern even when the seed crystal and/or the crucible are rotated as disclosed in Japanese Unexamined Patent Application Publication No. 6-183877, so that the solid-liquid interface portion of the single crystal may not be flattened.

Furthermore, even when the solid-liquid interface portion of the single crystal can be flattened by effecting the forced convection to spread in the radius direction through the rotation of the single crystal and/or the crucible, as disclosed in Japanese Unexamined Patent Application Publication No. 6-183877, in the process of forming the taper portion from the seed crystal, since the outer diameter of the crystal is small compared with that in the formation of the straight body portion of the single crystal, the forced convection to spread in the radius direction cannot be effected adequately. Consequently, in the stage of formation of the taper portion from the seed crystal, the melt in the crucible may exhibits an undesirable convection pattern, so that the solid-liquid interface portion of the single crystal may not be flattened, depending on the conditions of the size of the bottom of the crucible and the like. As described above, even in the technology of producing a single crystal disclosed in Japanese Unexamined Patent Application Publication No. 6-183877, since the solid-liquid interface portion of the single crystal is not flattened and the temperature distribution becomes nonuniform depending on the conditions of the size and the shape of the crucible and the like, the occurrence of defects, cracks, and the like may not be reduced, and it is difficult to reduce the fraction defective.

DISCLOSURE OF INVENTION

The object of the present invention is to reduce the fraction defective in the production of a single crystal.

One of primarily causes of the occurrence of defects, cracks, and the like generated in a crystal is attributed to that the outer perimeter portion of the single crystal is cooled prior to the central portion in a cooling process and, thereby, the temperature distribution in the single crystal becomes nonuniform. In particular, the inventors of the present invention found out that the effect of the thermal stress due to the temperature difference in the radius direction of the single crystal was large whereas the thermal stress due to the linear temperature distribution in the longitudinal direction of the single crystal was small. In this manner, the inventors of the present invention found out that it was effective to reduce the temperature difference in the radius direction of the single crystal by heating the outer perimeter of the crystal in the cooling process. Also, in addition to the reduction of the temperature difference in the radius direction of the single crystal, it was effective to cool only the upper end surface of the single crystal, i.e. the taper surface of the taper portion, so as to maintain the cooling rate by linearizing the temperature distribution in the longitudinal direction.

Accordingly, an apparatus for producing a single crystal of the present invention is configured to comprise a crucible for holding a raw material, a heating device for heating the raw material in the crucible, and a crystal transporting device for transporting a seed crystal upwards from the inside of the crucible, wherein the apparatus for producing a single crystal further comprises a heat conducting member which extends upwards at least from the vicinity of the upper end portion of the side wall of the crucible, which surrounds a formed single crystal, and which is made of a material having heat conductivity and, thereby, the above-described problems are solved.

By adopting such a configuration, when the single crystal leaving the crucible is cooled, the heat of the crucible below the single crystal is conducted by the heat conducting member to an upper portion outside the crucible, and the amount of the heat dissipated from the outer perimeter surface of the single crystal is reduced. In this manner, the temperature difference in the radius direction of the single crystal is reduced. Consequently, the occurrence of defects, cracks, and the like can be reduced, and the fraction defective can be reduced.

An apparatus for producing a single crystal of the present invention is configured to comprise a radiation heat blocking member of an interface portion between a taper portion, which is connected with the seed crystal of the formed single crystal and has a diameter gradually becoming increased, and a cylindrical straight body portion, which is connected with the taper portion of the formed single crystal, of the formed single crystal for blocking the radiation heat toward an upper portion above the interface portion, at least during cooling after the formation of a single crystal and, thereby, the above-described problems are solved.

In this manner, when the straight body portion of the single crystal leaving the crucible is cooled, the heat dissipation due to the radiant heat transfer from the outer perimeter surface of the straight body portion of the single crystal toward an upper portion is blocked and, in addition, the flow of a relatively-low-temperature gas from an upper portion above the apparatus into the surroundings of the outer perimeter surface of the straight body portion of the single crystal is blocked. And, the temperature difference in the radius direction of the single crystal is reduced. Furthermore, only the taper surface of the taper portion of the single crystal can be cooled so as to maintain the cooling rate by linearizing the temperature distribution in the longitudinal direction. Therefore, the occurrence of defects, cracks, and the like can be reduced, and the fraction defective can be reduced.

In addition, the radiation heat blocking member for blocking the radiation heat from the interface portion between the taper portion and the straight body portion toward an upper portion can be transported in a vertical direction and, a radiation heat blocking member transporting device for transporting this radiation heat blocking member in the vertical direction is comprised. By adopting such a configuration, the radiation heat blocking member can be positioned at the interface portion between the taper portion and the straight body portion during the formation of the single crystal as well, and the radiation heat and the like from the interface portion between the taper portion and the straight body portion toward an upper portion can be blocked. Consequently, the occurrence of defects, cracks, and the like can be further reduced, and the fraction defective can be further reduced.

The inventors of the present invention found out that another cause of the occurrence of defects, cracks, and the like generated in the crystal was attributed to the occurrence of roughening of the surface resulting from an excessive rise in the temperature of the taper surface of the taper portion during the formation of the single crystal. It is effective for suppressing the roughening of the taper surface to suppress the temperature rise of the taper surface of the taper portion during the formation of the taper portion in the initial stage of the growth of the single crystal, while the taper portion of the single crystal is positioned in the inside of the crucible. On the other hand, during the formation of the straight body portion of the single crystal after the taper portion of the single crystal is formed, it is effective for reducing the nonuniformity of the temperature distribution, i.e. the temperature difference, in the radius direction of the single crystal in the course of formation at the position of the liquid level of the melt, i.e. at the position of the solid-liquid interface, to increase the heat dissipation from the taper portion outside the crucible and to reduce the heat dissipation from the outer perimeter surface of the straight body portion inside the crucible.

Accordingly, a method for producing a single crystal of the present invention comprising the step of heating a crucible holding a raw material and pulling up a seed crystal while the seed crystal is in contact with a melt of the raw material so as to produce a single crystal, wherein the diameter of the single crystal is increased during formation of a taper portion of the single crystal in an initial stage of growth of the single crystal, and the single crystal is cylindrically grown connecting with the taper portion during formation of a straight body portion of the single crystal, while the radiation heat which reaches the taper portion of the single crystal from an inner surface of the crucible is blocked during the formation of the taper portion of the single crystal and, thereby, the above-described problems are solved.

An apparatus for producing a single crystal of the present invention is configured to comprise an in-crucible radiation heat blocking member which surrounds a single crystal and which blocks the radiation heat from an inner surface of the crucible toward the single crystal positioned in the inside of the crucible and an in-crucible radiation heat blocking member transporting device for transporting this radiation heat blocking member in a vertical direction, while the in-crucible radiation heat blocking member transporting device transports the in-crucible radiation heat blocking member to the position surrounding a taper portion of the single crystal during formation of the taper portion of the single crystal to increase the diameter of the single crystal in an initial stage of growth of the single crystal and transports the in-crucible radiation heat blocking member to the position at a distance from the single crystal during formation of a straight body portion of the single crystal cylindrically grown connecting with the taper portion and, thereby, the above-described problems are solved.

By adopting such a configuration, during the formation of the taper portion of the single crystal, the heating of the taper surface of the taper portion due to the radiation heat from the inner surface of the crucible is suppressed by the in-crucible radiation heat blocking member, the temperature rise of the taper surface can be suppressed, and the surface roughening of the taper surface can be suppressed. On the other hand, during the formation of the straight body portion of the single crystal, since the in-crucible radiation heat blocking member is transported to the position at a distance from the crystal, the heat dissipation from the taper portion of the single crystal toward an upper portion is not hindered, the outer perimeter surface of the straight body portion of the single crystal positioned in the inside of the crucible is applied with the radiation heat from the inner surface of the crucible and, thereby, a temperature drop of the outer perimeter portion of the straight body portion of the single crystal is reduced, so that the temperature difference in the radius direction of the single crystal at the surface of the crystal growth, i.e. at the position of the liquid level of the melt, can be reduced. Consequently, the occurrence of defects, cracks, and the like can be reduced, and the fraction defective can be reduced.

Furthermore, in a desirable configuration, a heating device is a high-frequency generation device including a high-frequency coil which is wound around the crucible while the axis is set in a vertical direction and which is energized by a high-frequency current, and the in-crucible radiation heat blocking member surrounding the single crystal, for blocking the radiation heat from the inner surface of the crucible toward the single crystal positioned in the inside of the crucible, is made of a nonmetallic material, and is in the shape of a cone provided with an opening capable of passing through the seed crystal and a rod-shaped or band-shaped seed holder of a crystal transporting device at the center or in the shape of a cylinder having an inner diameter larger than the diameter of the straight body portion of the single crystal.

In a method for producing a single crystal of the present invention, the diameter of the single crystal is increased during formation of a taper portion of the single crystal in an initial stage of growth of the single crystal, and the single crystal is cylindrically grown connecting with the taper portion during formation of a straight body portion of the single crystal, while the radiation heat toward an upper portion above the upper end portion of the crucible is blocked during the formation of the straight body portion of the single crystal and, thereby, the above-described problems are solved.

An apparatus for producing a single crystal of the present invention is configured to comprise a straight body portion radiation heat blocking member which can pass through a single crystal and which blocks the radiation heat from the upper end portion of the crucible toward an upper portion and a straight body portion radiation heat blocking member transporting device for transporting the straight body portion radiation heat blocking member in a vertical direction, while a heating device heats a portion in the side lower than the upper end portion of the crucible, and the straight body portion radiation heat blocking member transporting device transports the straight body portion radiation heat blocking member to the position at a distance from the upper end portion of the crucible during formation of a taper portion of the single crystal to increase the diameter of the single crystal in an initial stage of growth of the single crystal and positions the straight body portion radiation heat blocking member in between the outer perimeter surface of the straight body portion of the single crystal and the inner perimeter surface of the crucible or in between the outer perimeter surface of the straight body portion of the single crystal and the upper end portion of the crucible during formation of the straight body portion of the single crystal cylindrically grown connecting with the taper portion and, thereby, the above-described problems are solved.

In this manner, during the formation of the straight body portion of the single crystal, since the heat dissipation from the outer perimeter surface of the straight body portion of the single crystal in the crucible is reduced by the straight body portion radiation heat blocking member, the temperature difference in the radius direction of the single crystal at the surface of the growth of the single crystal, i.e. at the position of the liquid level of the melt, can be reduced. On the other hand, during the formation of the taper portion of the single crystal, since nothing hinders the heat dissipation from the taper surface of the taper portion, the heat is dissipated from the taper portion toward an upper portion. Therefore, the temperature rise of the taper surface can be suppressed, and the roughening of the surface can be suppressed by reducing the amount of heating of the portion located higher than the liquid level of the melt in the crucible. Consequently, the occurrence of defects, cracks, and the like can be reduced, and the fraction defective can be reduced.

Furthermore, in the configuration, when a heating device is a high-frequency generation device including a high-frequency coil which is wound around the crucible while the axis is set in a vertical direction and which is energized by a high-frequency current, and the radiation heat blocking member which can pass through the single crystal and which blocks the radiation heat from the upper end portion of the crucible toward an upper portion is made of a metal. In this manner, the heat dissipation from the outer perimeter of the straight body portion of the single crystal is further reduced, and the temperature difference in the radius direction of the single crystal at the surface of the growth of the single crystal, i.e. at the position of the liquid level of the melt, can be further reduced.

An apparatus for producing a single crystal of the present invention is configured to comprise a crucible for holding a raw material, a high-frequency generation device including a high-frequency coil disposed surrounding the crucible, and a crystal transporting device for rotating and transporting a seed crystal upwards from the inside of the crucible, wherein the apparatus for producing a single crystal includes a wall-side heating member for heating a portion in between the upper end portion and the lower end portion of the side wall of the crucible by the operation of the high-frequency generation device and, thereby, the above-described problems are solved.

By adopting such a configuration, when the wall-side heating member is included, the portion in between the upper end portion and the lower end portion of the crucible is also heated in addition to the upper end portion and the lower end portion of the crucible and, therefore, the temperature distribution of the side wall of the crucible can be uniformed. As a result, the convection of the melt which rises along the side wall of the crucible toward the liquid level can be effected, and the melt in the crucible can be prevented from exhibiting an undesired convection pattern. Consequently, the solid-liquid interface portion of the single crystal can be flattened regardless of conditions, e.g., the size and the shape of the crucible, the occurrence of defects, cracks, and the like can be reduced, and the fraction defective can be reduced.

An apparatus for producing a single crystal of the present invention is configured to include a bottom-side heating member for heating a central portion of the bottom by the operation of the high-frequency generation device, on the bottom of the crucible and, thereby, the above-described problems are solved.

By adopting such a configuration, when the bottom-side heating member is included, the central portion of the bottom is heated in addition to the lower end portion, i.e. the periphery of the bottom of the crucible. Therefore, the convection of the melt can be effected, wherein the melt rises from the central portion of the bottom of the crucible toward the solid-liquid interface portion of the seed crystal or the single crystal, impinges on the solid-liquid interface portion of the seed crystal or the single crystal, and spreads in the radius direction and, thereby, the melt in the crucible can be prevented from exhibiting an undesired convection pattern. Consequently, the solid-liquid interface portion of the single crystal can be flattened regardless of conditions, e.g., the size and the shape of the crucible, the occurrence of defects, cracks, and the like can be reduced, and the fraction defective can be reduced.

In the configuration, the wall-side heating member is composed of a protrusion-shaped member which is made of an electrically conductive material and which is disposed in between the upper end portion and the lower end portion of the outer surface of the side wall of the crucible while being extended along the circumferential direction of the outer surface of the side wall of the crucible. By adopting such a configuration, an electromagnetic field generated by the high-frequency coil concentrates on a pointed corner portion close to the high-frequency coil. Consequently, the wall-side heating member formed from the protrusion-shaped member also generates heat in addition to the upper end portion and the lower end portion of the crucible due to the electromagnetic field generated by the high-frequency coil, and the portion in between the upper end portion and the lower end portion of the crucible can be heated.

Furthermore, in the configuration, the bottom-side heating member is composed of a heat conducting portion made of a heat conductive material for conducting heat to a central portion of the outer surface of the bottom of the crucible and a board-shaped heat generation portion which has a diameter larger than the diameter of the heat conducting portion and which is made of an electrically conductive material. In the configuration, the bottom-side heating member is composed of a heat insulating member made of a heat insulating material having a through hole serving as a heat conducting portion at the position in accordance with the central portion of the outer surface of the bottom of the crucible and a board-shaped heat generation portion which has a diameter larger than the diameter of the through hole of this heat insulating member and which is made of an electrically conductive material. By adopting such a configuration, an electromagnetic field generated by the high-frequency coil concentrates on a pointed corner portion close to the high-frequency coil. Consequently, the periphery of the heat generation portion of the bottom-side heating member also generates heat due to the electromagnetic field generated from the high-frequency coil. Since the heat from this heat generation portion is conducted to the central portion of the bottom of the crucible via the heat conducting portion of the bottom-side heating member or the through hole of the heat insulating member, the central portion of the bottom of the crucible can be heated.

In the configuration, when the heat generation portion is in the shape of a disk, and the diameter of the heat generation portion is larger than or equal to two-thirds the diameter of the bottom of the crucible, the periphery of the heat generation portion is allowed to reliably generate heat by the high-frequency generation device.

The wall-side heating member and the bottom-side heating member are configured to be attached to the crucible while being attached and detached at will. Furthermore, in the configuration, a heating member transporting device is included for transporting the wall-side heating member and the bottom-side heating member between the position at which the wall-side heating member and the bottom-side heating member are in contact with the crucible and the position at which the wall-side heating member and the bottom-side heating member are at a distance from the crucible. By adopting such a configuration, the wall-side heating member and the bottom-side heating member are attached to or detached from the crucible in accordance with, for example, the stage of the formation of the single crystal, and the heating of the side wall and the bottom of the crucible by the wall-side heating member and the bottom-side heating member can be selected as needed.

In the formation of a single crystal by the use of the apparatus for producing a single crystal comprising the high-frequency generation device including the high-frequency coil and the crystal transporting device for rotating and transporting a seed crystal upwards from the inside of the above-described crucible, when the single crystal is formed by a method in which at least one of the portion in between the upper end portion and the lower end portion of the side wall of the crucible and a central portion of the bottom of the crucible is heated, the distribution of heating of the melt in the crucible can be controlled and, thereby, the quality of the formed single crystal can be improved.

A single crystal which is produced by any one of the above-described apparatuses for producing a single crystal or methods for producing a single crystal can be improved in its quality.

BEST MODE FOR CARRYING OUT THE INVENTION

First Embodiment

Figure 1:
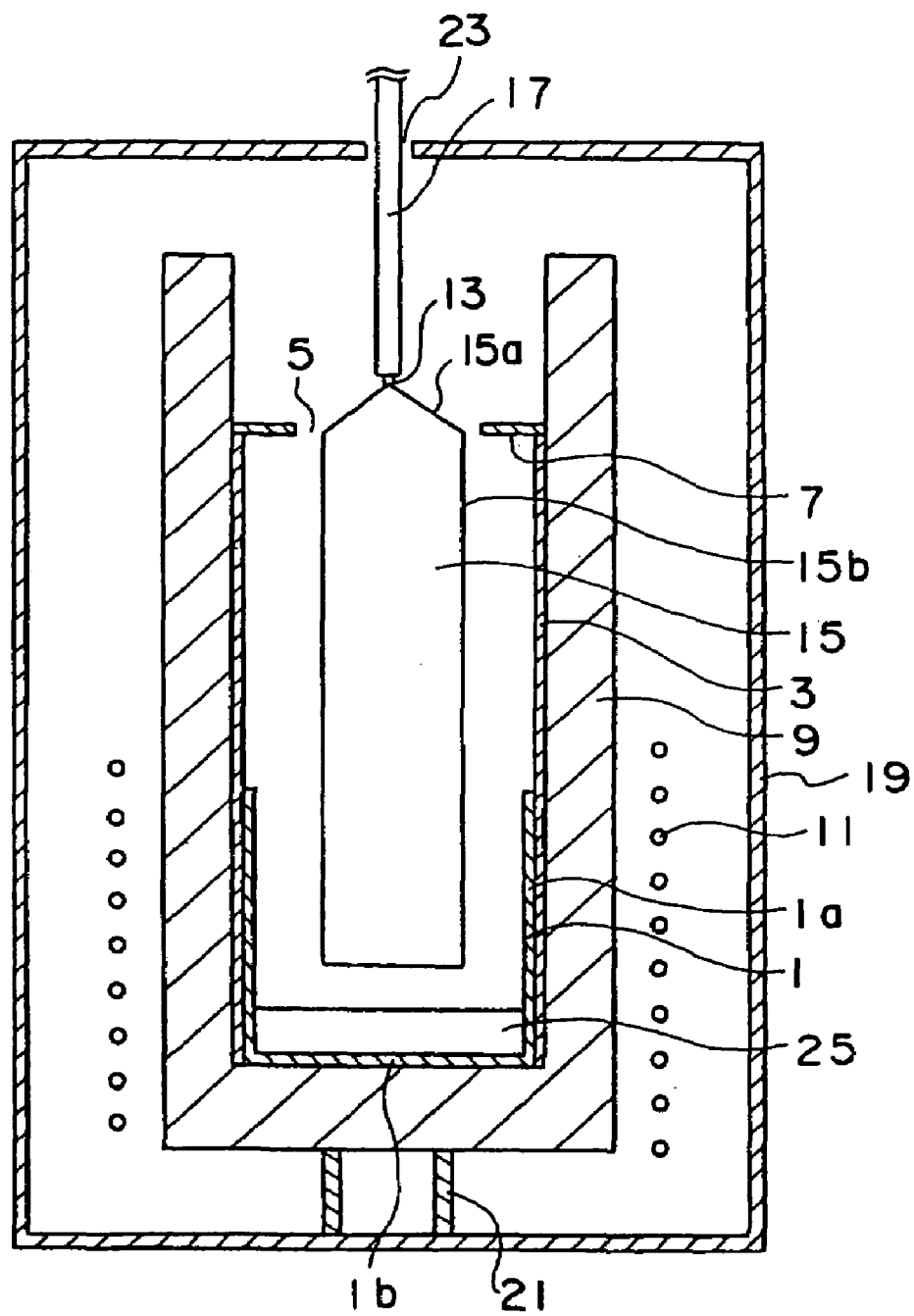
FIG. 1 is a vertical sectional view showing the schematic configuration of a first embodiment of the apparatus for producing a single crystal, according to the present invention, under the condition of cooling process.
Figure 2:
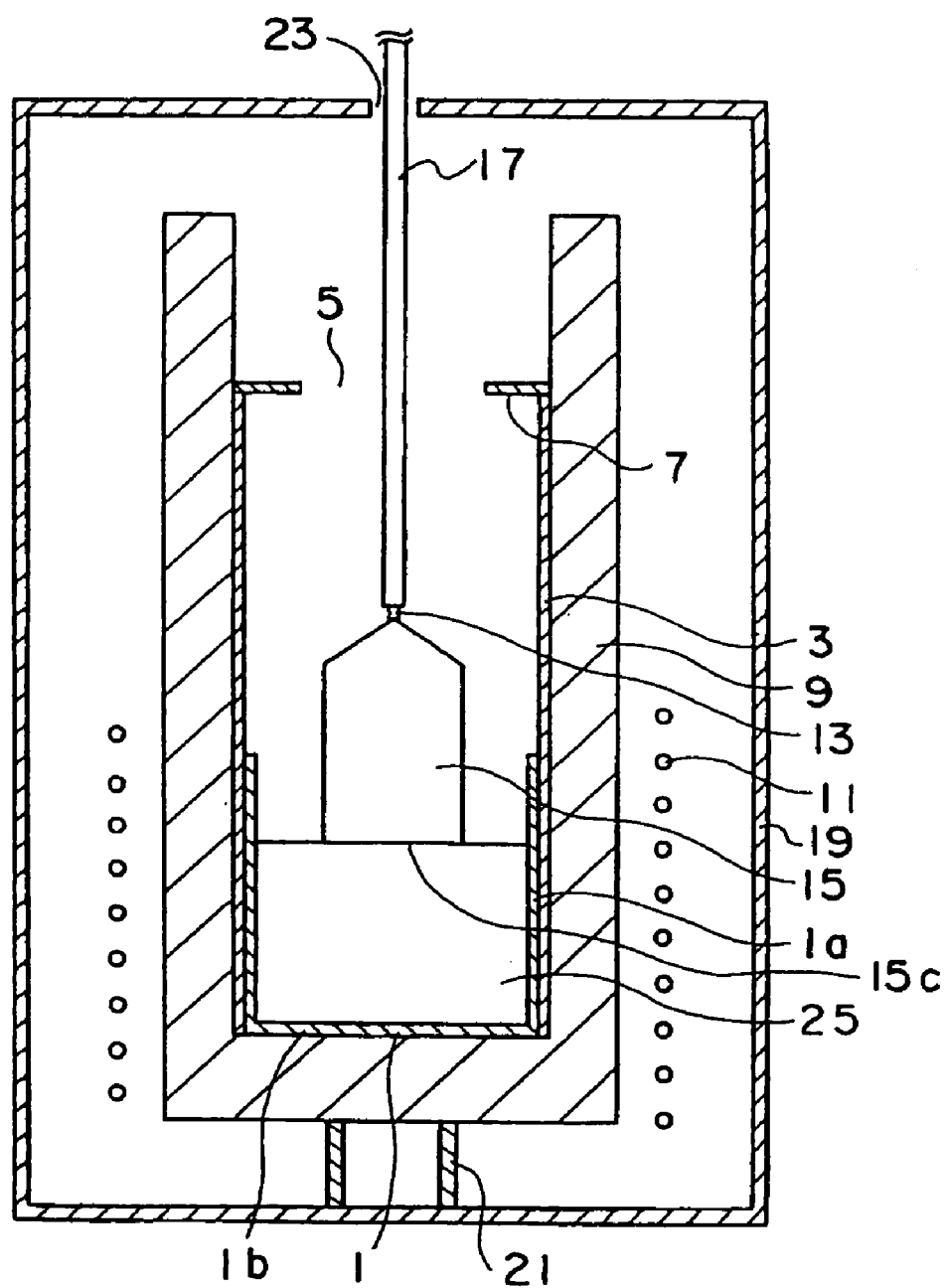
FIG. 2 is a vertical sectional view showing the schematic configuration of the first embodiment of the apparatus for producing a single crystal, according to the present invention, under the condition of a formation process.

The first embodiment of a technology of producing a single crystal, according to the present invention, will be described below with reference to FIG. 1 and FIG. 2. FIG. 1 is a vertical sectional view showing the schematic configuration of an apparatus for producing a single crystal, according to the present invention, under the condition of cooling process. FIG. 2 is a vertical sectional view showing the schematic configuration of the apparatus for producing a single crystal, according to the present invention, under the condition of formation process.

The apparatus for producing a single crystal of the present embodiment is an apparatus for producing a single crystal having a melting point of at least 1,500° C., for example. As shown in FIG. 1 and FIG. 2, the apparatus is provided with, for example, a cylindrical crucible 1, a cylindrical heat conducting member 3 which surrounds the outer surface of a side wall 1a of the crucible 1 and which has a height larger than the height of the crucible 1, a radiation heat blocking member 7 serving as a disk-shaped interface portion radiation heat blocking member which is disposed at the upper end portion of the heat conducting member 3 and which has an opening 5 in a central portion, a refractory 9 surrounding the outside of the heat conducting member 3, a high-frequency generation device including a high-frequency coil 11 which generates high frequencies in the outside of the refractory 9, and a crystal transporting device which includes a rod-shaped or band-shaped seed holder 17 for holding a seed crystal 13 and a formed single crystal 15 and which rotates and pulls up the crystal held by the seed holder 17 toward an upper portion.

The crucible 1 is a cylindrical vessel in which the upper end is opened and the lower end is blocked to form a bottom 1b, and which is formed from an electrically conductive, high-melting point metallic material, e.g., iridium, platinum, tungsten, or molybdenum. The heat conducting member 3 is formed from a heat conductive material, e.g., high thermal conductivity alumina, ceramic, or iridium. The heat conducting member 3 is in the shape of a cylinder in which the upper end and the lower end are opened and the inner diameter is equal to the outer diameter of the crucible 1 or larger than the outer diameter of the crucible 1, and is disposed while surrounding the crucible 1 and a space above the crucible 1. When the single crystal 15 is held during the cooling process in the production of the single crystal, as shown in FIG. 1, the upper end of the heat conducting member 3 is located at the position in accordance with the interface portion between a taper portion 15a of the single crystal 15 which is in the shape of a cone having a diameter gradually becoming increased, and a straight body portion 15b which is in the shape of a cylinder formed connecting with the taper portion 15a.

The radiation heat blocking member 7 serving as an interface portion radiation heat blocking member is in the shape of a disk or a flat-plate ring in which an opening having a diameter larger than the diameter of the straight body portion 15b of the single crystal 15 is formed in a central portion, and is formed from a material capable of blocking the radiation heat, e.g., iridium, alumina, ceramic, or zirconia. The radiation heat blocking member 7 is held at the position in accordance with the upper end of the heat conducting member 3, i.e., at the position in accordance with the interface portion between the taper portion 15a and the straight body portion 15b of the single crystal 15 held during the cooling process in the production of the single crystal, while the periphery is attached to the refractory 9. It is desirable that the opening disposed in the central portion of the radiation heat blocking member 7 is formed to have a minimum diameter in order to avoid becoming in contact with the single crystal 15. The material for forming the radiation heat blocking member 7 may be a heat conductive material or be a heat insulating material as long as the material can block the radiation heat. However, it is desirable to use the heat insulating material from the viewpoint of an improvement in capability of blocking the radiation heat.

The refractory 9 is a cylindrical vessel in which the upper end is opened and the lower end is blocked to form a bottom and which is larger than the crucible 1 and the heat conducting member 3. The refractory 9 is formed from a high-temperature resistant material having an electrical insulation property and a heat insulation property, e.g., low thermal conductivity alumina, zirconia, or alumina wool. The height of the refractory 9 is larger than the height of the heat conducting member 3. The high-frequency generation device is provided with, for example, a high-frequency power source not shown in FIG. 1 and FIG. 2, and a high-frequency coil 11 electrically connected to the high-frequency power source with a wire not shown in the drawing. The high-frequency coil 11 is disposed outside the refractory 9 at the position in accordance with the side wall 1a of the crucible 1 while surrounding the outside of this refractory 9 with the center axis pointing in a vertical direction. The crystal transporting device is provided with, for example, the rod-shaped or band-shaped seed holder 17 and a driving mechanism, although not shown in the drawing, for hanging the seed holder 17 and for rotating and pulling up the seed holder 17.

The crucible 1, the heat conducting member 3, the radiation heat blocking member 7, the refractory 9, the high-frequency coil 11, a part of the seed holder 17, and the like are contained in a vessel 19. The crucible 1 is supported on the support member 21 disposed on the bottom surface of the vessel 19. A through hole 23 is formed in the ceiling of the vessel 19 at the position in accordance with the central portion of the opening of the crucible 1. The seed holder 17 is inserted through this through hole 23 while hanging from an upper portion.

The operation of the apparatus for producing a single crystal having such a configuration and characteristic portions of the present invention will be described. A crystal material serving as a raw material for the crystal, e.g., $Gd_2SiO_5$, $Bi_4Ge_3O_{12}$, or $Lu_2SiO_5$ is held in the crucible 1 and, thereby, a melt 25 is prepared. When a high-frequency current is passed from the high-frequency power source, although not shown in the drawing, through the high-frequency coil 11, an induced current passes through the electrically conductive crucible 1. In this manner, the crucible 1 is heated by Joule heating, the temperature of the crucible 1 is raised and, thereby, the melt 25 in the crucible 1 becomes in a heated state. When the seed crystal 13 held at the lower end portion of the seed holder 17 is brought into contact with this melt 25 in this state and is pulled up from the melt 25, the single crystal 15 is formed, as shown in FIG. 2. The production of the single crystal includes a formation process in which, initially, a taper portion 15a of the single crystal 15 is formed into the shape of a cone connecting with the seed crystal 13 and having a diameter gradually becoming increased and, thereafter, a cylindrical straight body portion 15b is formed connecting with the taper portion 15a, as shown in FIG. 2, and a cooling process in which the formed single crystal 15 in a state of being pulled up is stood while being held by the seed holder 17 so as to be cooled, as shown in FIG. 1.

In the formation process shown in FIG. 2, the heat is dissipated from the surfaces of the seed crystal 13 and the single crystal 15 toward the ceiling of the vessel 19 by the radiative transfer, the formed single crystal 15 is further cooled by the heat conduction via the seed crystal 13 and the seed holder 17 and, thereby, the temperature becomes lower than or equal to the melting point of the crystal material. Consequently, the lower surface of the single crystal 15 in contact with the melt 25 becomes a growth surface 15c, and a fresh crystal grows.

At this time, the heat generation of the crucible 1 occurs in both the portion in contact with the melt 25 and the portion located above the melt 25. The heat generated by the heat generation of this crucible 1 is conducted to an upper portion above the crucible 1 by conduction through the conductive member 3. Therefore, the temperature at any height in the space surrounded by the conductive member 3 becomes close to the temperature of the single crystal 15 immediately after formation compared with that in the case where the conductive member 3 is not disposed. Consequently, in the formation process, the heat dissipation from the outer perimeter surface of the single crystal 15, which leaves the crucible 1 towards an upper portion and is cooled, to the space surrounding the single crystal 15 in the outside of the crucible 1 by the radiative transfer is reduced and, thereby, the temperature difference in the radius direction of the single crystal 15 is reduced.

On the other hand, in the cooling process, as shown in FIG. 1, the long-grown single crystal 15 is isolated from the melt 25, and is cooled to room temperature by gradually reducing the amount of heating. In this cooling process, the adequately long-grown single crystal 15 is transported toward an upper portion, and is isolated from the melt 25. The temperature is lowered by gradually reducing the high-frequency electric power generated from the high-frequency coil 11. At this time, as in the formation process, the heat dissipation from the outer perimeter surface of the single crystal 15 to the space surrounding the single crystal 15 in the outside of the crucible 1 is reduced by the conduction of the heat due to the heat generation of the crucible 1 to the conductive member 3.

Furthermore, in the cooling process, since the radiation heat blocking member 7 is disposed at the position in accordance with the interface portion between the taper portion 15a and the straight body portion 15b of the single crystal 15, the radiation heat blocking member 7 performs the function of a lid, and the heat dissipation by the radiative transfer from the interface portion between the taper portion 15a and the straight body portion 15b of the single crystal 15 toward an upper portion is reduced. A relatively-low-temperature gas at the ceiling portion and the like in the vessel 19 is resistant to flow downwards into a portion below the interface portion between the taper portion 15a and the straight body portion 15b of the single crystal 15. Therefore, only the straight body portion 15b of the single crystal 15 is thermally insulated, and a condition in which only the heat dissipation from the straight body portion 15b of the single crystal 15 is reduced is brought about. In this manner, the temperature difference in the radius direction of the straight body portion 15b of the single crystal 15 is reduced.

In general, in the cooling process, since the heat generation of the crucible 1 is small in contrast to that in the formation process, the temperature difference in the radius direction of the single crystal, i.e. a nonuniform temperature distribution, tends to occur. However, in the present embodiment, the action of the conductive member 3 and the action of the radiation heat blocking member 7 are combined and, thereby, the heat dissipation from the outer perimeter surface of the straight body portion 15b of the single crystal 15 is reduced in the cooling process, and the temperature difference in the radius direction is reduced. Furthermore, in the taper portion 15a of the single crystal 15, the heat is dissipated by the radiative transfer from the taper surface of the taper portion 15a and the convective heat transfer due to the flow of the relatively-low-temperature gas in the vessel 19 to the taper surface of the taper portion 15a and, thereby, the single crystal 15 can be cooled at an appropriate cooling rate. A temperature gradient having a constant linear temperature distribution occurs in a vertical direction, i.e. in a longitudinal direction, of the single crystal 15 due to the heat dissipation from the taper surface of the taper portion 15a. However, since the thermal stress due to this temperature gradient, i.e. the temperature difference, in the longitudinal direction is small, defects, cracks, and the like are resistant to occur due to this temperature difference in the longitudinal direction.

As described above, in the apparatus for producing a single crystal and the method for producing a single crystal of the present embodiment, the heat conducting member 3 is comprised, and when the single crystal 15 leaving the crucible 1 is cooled, the heat of the crucible 1 is conducted by the heat conducting member 3 to the space located outside and above the crucible 1 and surrounded by the heat conducting member 3 and, thereby, the amount of the heat dissipated from the outer perimeter surface of the single crystal 15 is reduced. Consequently, the temperature difference in the radius direction of the single crystal 15 is reduced. Therefore, the occurrence of defects, cracks, and the like can be reduced, and the fraction defective can be reduced in the production of the single crystal.

Furthermore, in the apparatus for producing a single crystal and the method for producing a single crystal of the present embodiment, since the radiation heat blocking member 7 for blocking the radiation heat toward an upper portion above the interface portion between the taper portion 15a and the straight body portion 15b of the single crystal 15 is comprised, when the single crystal 15 is cooled in the cooling process, the heat dissipation from the outer perimeter surface of the straight body portion 15b of the single crystal 15 by the radiative transfer is blocked and, in addition, the flow of a relatively-low-temperature gas from the vicinity of the ceiling in the vessel 19 into the space surrounding the outer perimeter surface of the straight body portion 15b of the single crystal 15 is blocked. Consequently, the temperature difference in the radius direction in the straight body portion 15b of the single crystal 15 is reduced. Furthermore, only the taper surface of the taper portion 15a of the single crystal 15 is cooled so as to linearize the temperature distribution in the longitudinal direction of the single crystal 15 and, thereby, the cooling rate can be maintained. Therefore, the occurrence of defects, cracks, and the like can be reduced, and the fraction defective can be reduced in the production of the single crystal.

In addition, in the apparatus for producing a single crystal and the method for producing a single crystal of the present embodiment, since the heat conducting member 3 is comprised together with the radiation heat blocking member 7, the effect of heat-insulating the straight body portion 15b of the single crystal 15 can be improved in the cooling process, the occurrence of defects, cracks, and the like can be further reduced, and the fraction defective can be further reduced in the production of the single crystal.

That the occurrence of defects, cracks, and the like can be further reduced refers to that dropouts of crystal can be reduced while the dropouts lead to defects and cracks. Since dropouts of crystal in the product of single crystal can be reduced, the quality of the product of single crystal can also be improved.

In the known technology of forming a single crystal, the radiation heat reflector is disposed at the position immediately above the single crystal, the lid is disposed on the upper portion of the refractory in the cooling process, or the lid is disposed on the upper portion of the crucible. Consequently, the cooling time is increased in the formation process or the cooling process, the growth rate of the single crystal in the formation process is reduced and, in addition, the cooling time of the single crystal is increased in the cooling process. Therefore, a problem occurs in that the production capacity is reduced.

In contrast to this, with respect to the technology of producing a single crystal of the present embodiment, there is no member serving as a lid in the condition of the formation process, and the heat can be dissipated from the taper portion of the single crystal in the condition of the cooling process. Consequently, the growth rate of the single crystal is resistant to be reduced in the formation process, and the cooling time is resistant to be increased in the cooling process. Therefore, a reduction in the production capacity can be suppressed.

Figure 3:
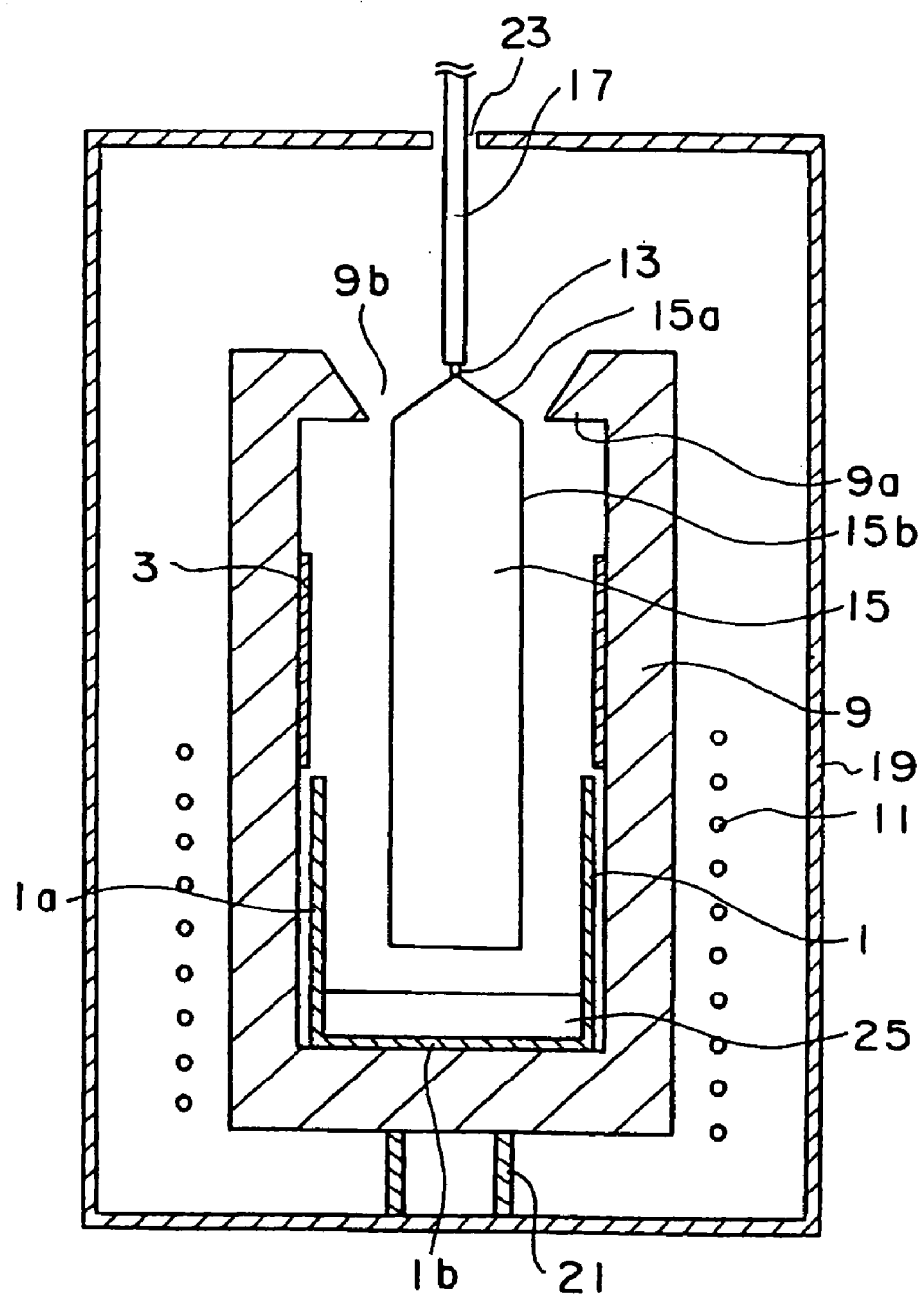
FIG. 3 is a vertical sectional view showing a modified example of the apparatus for producing a single crystal of the first embodiment.

In the present embodiment, the disk-shaped radiation heat blocking member 7 which was disposed at the upper end portion of the heat conducting member 3 and which had an opening 5 in the central portion was shown as the interface portion radiation heat blocking member. However, the interface portion radiation heat blocking member is not limited to have such a configuration, and can have various configurations as long as the interface portion radiation heat blocking member is disposed at the position in accordance with the interface portion between the straight body portion and the taper portion of the single crystal and can block the radiation heat towards an upper portion. For example, as shown in FIG. 3, in the configuration, the upper end portion of the refractory 9 may be set at the position in accordance with the interface portion between the taper portion 15a and the straight body portion 15b of the single crystal 15, and a lid portion 9a may be formed as the interface portion radiation heat blocking member on this upper end portion of the refractory 9 while protruding in the shape of a ring toward the single crystal from this upper end portion.

At this time, since the refractory 9 has a certain thickness, the lower surface of the lid portion 9a of the refractory 9 is set at the position in accordance with the interface portion between the taper portion 15a and the straight body portion 15b of the single crystal 15, and an opening 9b formed in the central portion of the lid portion 9a is made to be a taper-shaped opening having a diameter gradually becoming increased with height. In this manner, the radiation heat toward an upper portion above the interface portion between the taper portion 15a and the straight body portion 15b of the single crystal 15 can be blocked and, in addition, the taper portion 15a of the single crystal 15 can be prevented from being heat-insulated by being surrounded by the lid portion 9a of the refractory 9 having a certain thickness.

In the present embodiment, the cylindrical heat conducting member 3 which surrounded the outer surface of the side wall 1a of the crucible 1 and which had a height larger than the height of the crucible 1 was shown as the heat conducting member. However, the heat conducting member is not limited to have such a configuration, and can have various configurations as long as the heat conducting member can conduct the heat of the crucible 1 or the vicinity of the crucible 1 toward an upper portion. For example, as shown in FIG. 3, the lower end portion of the heat conducting member may be positioned in the vicinity of the upper end portion of the crucible 1, and the upper end portion of the heat conducting member may be positioned at some midpoint of the height of the straight body portion 15b of the single crystal 15 in the cooling process. As described above, the heat conducting member is not necessarily in contact with the crucible 1, nor surrounds the crucible 1. The height can also be appropriately selected depending on the conditions, for example, whether the interface portion radiation heat blocking member is disposed or not.

In the configuration shown in the present embodiment, both the radiation heat blocking member 7 serving as the interface portion radiation heat blocking member and the heat conducting member 3 were disposed. However, the effect of the present invention can be achieved even when any one of the interface portion radiation heat blocking member and the heat conducting member is disposed. Here, an example will be shown, in which the effect was calculated by numerical simulations with respect to the case where the interface portion radiation heat blocking member was disposed alone. The temperature distribution in the crystal was calculated on the case where the radiation heat blocking member 7 as shown in FIG. 1 was disposed or not disposed under the calculation condition that the crystal material was $Gd_2SiO_5$ having a melting point of 1,950° C. As a result of the calculation, the temperature difference in the radius direction at the height of the central portion of the single crystal 15 in the cooling process was on the order of 50° C. in the case where the radiation heat blocking member 7 was not disposed, and was on the order of 35° C. in the case where the radiation heat blocking member 7 was disposed. In this manner, even when the interface portion radiation heat blocking member is disposed alone, the temperature difference in the radius direction of the single crystal in the cooling process can be reduced, cracks and the like due to the thermal stress can be prevented and, thereby, a reduction of the fraction defective, an improvement in the quality, and the like can be achieved. However, when both the interface portion radiation heat blocking member and the heat conducting member are disposed, these effects can be improved compared with the effects exhibited when any one of them is disposed.

Second Embodiment

Figure 4:
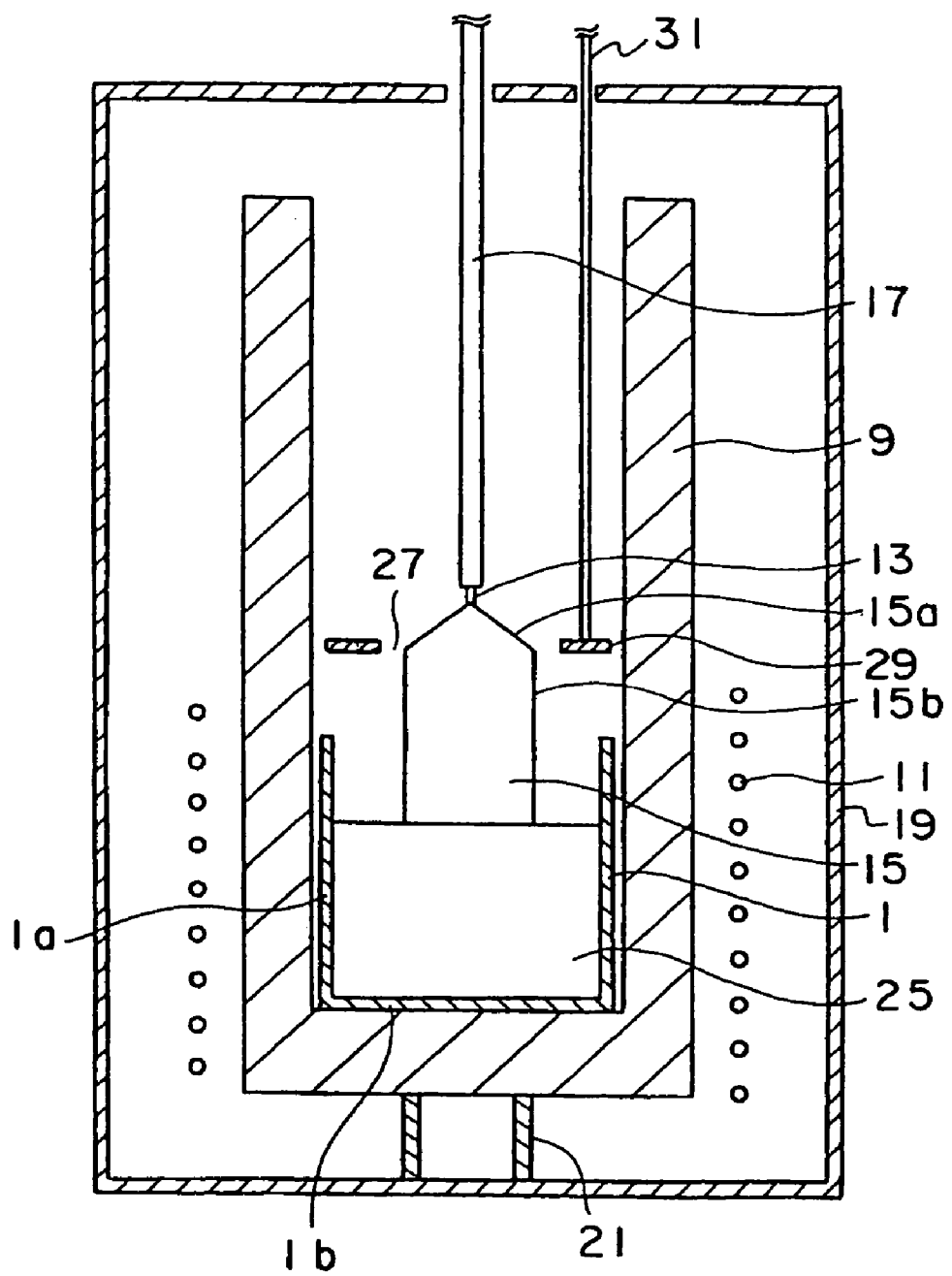
FIG. 4 is a vertical sectional view showing the schematic configuration of a second embodiment of the apparatus for producing a single crystal, according to the present invention, under the condition of a formation process.

The second embodiment of the technology of producing a single crystal, according to the present invention, will be described below with reference to FIG. 4. FIG. 4 is a vertical sectional view showing the schematic configuration of an apparatus for producing a single crystal, according to the present invention, under the condition of formation process. In the present embodiment, the same elements and operations as those in the first embodiment are indicated by the same reference numerals as in the first embodiment, explanations thereof will not be provided, and configurations, characteristic portions, and the like different from those in the first embodiment will be described.

The technology of producing a single crystal of the present embodiment is different from the first embodiment in the point that the interface portion radiation heat blocking member can be transported in a vertical direction. As shown in FIG. 4, an apparatus for producing a single crystal of the present embodiment is provided with, for example, a disk ring-shaped radiation heat blocking member 29 including a through hole 27 in accordance with the diameter of a straight body portion 15b of a single crystal 15 in a central portion and an interface portion radiation heat blocking member transporting device for supporting the radiation heat blocking member 29 and, in addition, for transporting it in a vertical direction. The radiation heat blocking member 29 serving as the interface portion radiation heat blocking member with the surfaces of the disk facing in a vertical direction is supported by a rod-shaped support member constituting the interface portion radiation heat blocking member transporting device. The interface portion radiation heat blocking member transporting device supports the radiation heat blocking member 29 and is composed of, for example, the rod-shaped support member 31 which is inserted through a through hole disposed in the ceiling of a vessel 19 and which is extended in a vertical direction and a transporting mechanism, although not shown in the drawing, disposed in the outside of the vessel 19 to transport the support member 31 in the vertical direction.

In the present embodiment described above, the radiation heat blocking member 29 is located at the position in accordance with the interface portion between the taper portion 15a and the straight body portion 15b of the single crystal 15 in the formation process as well as in the cooling process, and is transported upwards with the growth of the single crystal 15. As a result, in both the formation process and the cooling process, the temperature difference in the radius direction of the single crystal 15 is reduced by the action of the radiation heat blocking member 29, and the fraction defective can be reduced in the production of the single crystal.

Furthermore, the effects of improving the quality and improving the production capacity can also be achieved.

Such an operation that the radiation heat blocking member 29 is isolated from the single crystal 15 and a refractory 9 and is transported to an upper portion of the apparatus in the formation process, and the radiation heat blocking member 29 is positioned at the interface portion of the single crystal 15 in only the cooling process can also be performed depending on the conditions, e.g., the type of single crystal to be produced. In this case, since there is no radiation heat blocking action by the radiation heat blocking member 29 in the formation process, the growth rate can be increased by the heat dissipation from the surroundings of the single crystal 15, and the temperature distribution in the radius direction of the single crystal 15 can be uniformed in only the cooling process. The temperature difference in the radius direction of the crystal occurs in the formation process of the single crystal 15 depending on the conditions, e.g., the type of single crystal to be produced. Fluidity is exhibited as the property of the material for the crystal depending on the conditions, e.g., the type of single crystal to be produced. However, when the temperature becomes close to the melting point, thereby, defects, cracks, and the like may be resistant to occur.

Third Embodiment

Figure 5:
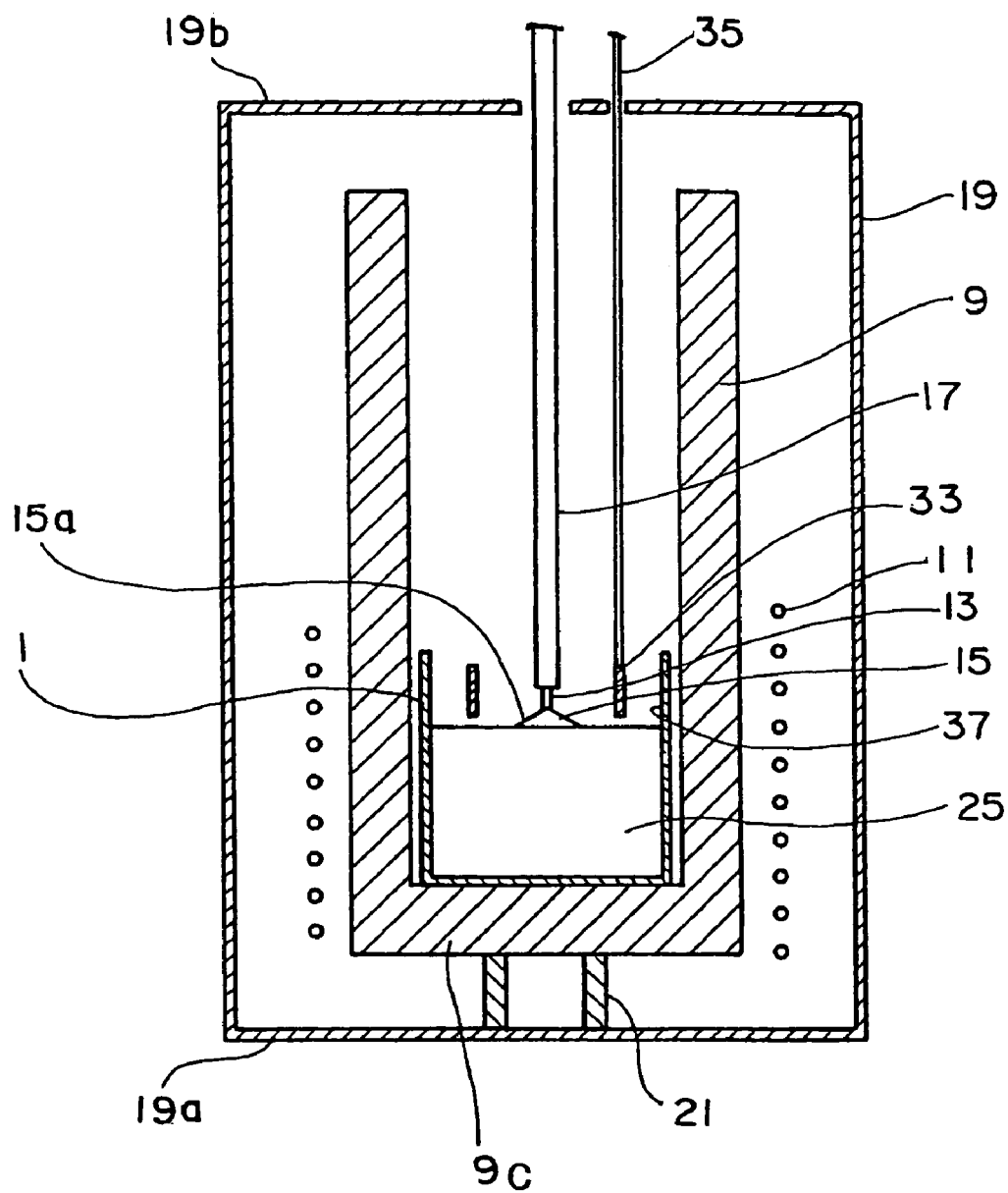
FIG. 5 is a vertical sectional view showing the schematic configuration of a third embodiment of the apparatus for producing a single crystal, according to the present invention, under the condition of forming a taper portion in a formation process.
Figure 6:
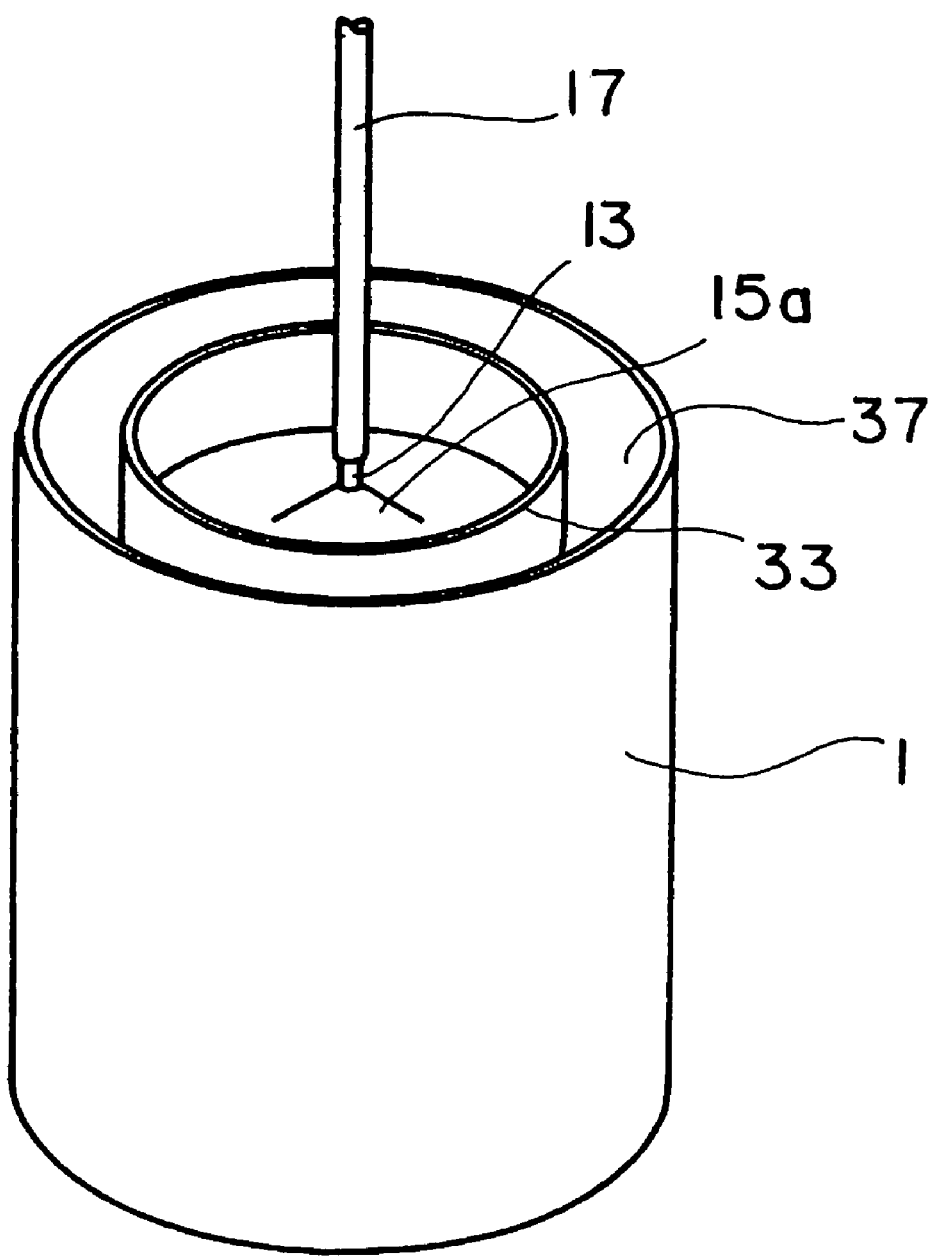
FIG. 6 is a perspective view of the vicinity of a crucible for explaining the arrangement of a radiation heat blocking tube during the formation of a taper portion of a single crystal.
Figure 7:
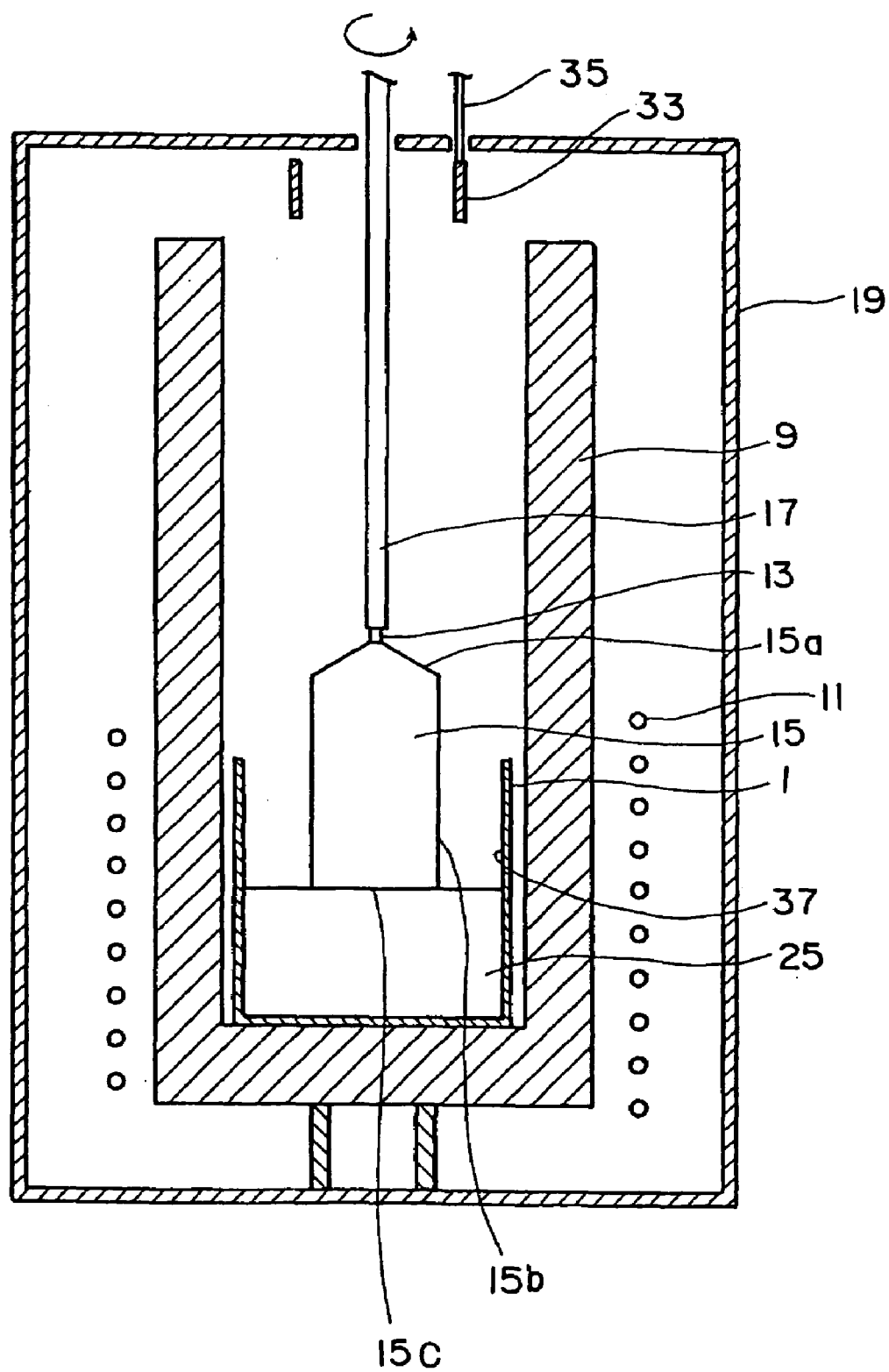
FIG. 7 is a vertical sectional view of the apparatus for producing a single crystal shown in FIG. 5, under the condition of forming a straight body portion in the formation process.

The third embodiment of the technology of producing a single crystal, according to the present invention, will be described below with reference to FIG. 5 to FIG. 7. FIG. 5 is a vertical sectional view showing the schematic configuration of an apparatus for producing a single crystal, according to the present invention, under the condition of formation of a taper portion in a formation process. FIG. 6 is a perspective view of the vicinity of a crucible for explaining the arrangement of a radiation heat blocking tube during the formation of the taper portion of the single crystal. FIG. 7 is a vertical sectional view of the apparatus for producing a single crystal shown in FIG. 5, under the condition of forming a straight body portion in the formation process. In the present embodiment, the same elements and operations as those in the first and the second embodiments are indicated by the same reference numerals as in those embodiments.

As shown in FIG. 5, the apparatus for producing a single crystal of the present embodiment is configured to include a cylindrical vessel 19 which is disposed with an axis line being set in vertical direction and which has a rectangular vertical cross section, a refractory 9 which is a cylindrical heat insulating material supported by a support member 21 on the upper surface of a bottom 19a of the vessel 19 and which is disposed concentrically with the vessel 19, a crucible 1 disposed concentrically with the refractory 9, on a bottom 9c of the refractory 9, a crystal transporting device including a rod-shaped or band-shaped seed holder 17 which is inserted through an opening formed in a central portion of an upper surface 19b of the vessel 19 and which is disposed while being allowed to vertically move along a center line of the refractory 9, a seed crystal 13 attached to the lower end of the seed holder 17, a radiation heat blocking tube 33 serving as an in-crucible radiation heat blocking member disposed concentrically with the rod-shaped or band-shaped seed holder 17 and configured to be allowed to vertically move along the center line of the refractory 9, a radiation heat blocking tube transporting device serving as an in-crucible radiation heat blocking member transporting device which is inserted through an opening formed in the central portion of the upper surface 19b of the vessel 19 and which vertically transports the radiation heat blocking tube 33 along the center line of the refractory 9, and a high-frequency coil 11 for high-frequency induction heating of the crucible 1, the coil being wound around the outer perimeter of the lower portion of the refractory 9, concentrically with the refractory 9.

The vessel 19 is in the shape of a cylinder with the top and the bottom being closed, and the upper surface 19b is provided with the above-described opening for passing through the seed holder 17 and an opening for passing through a support member 35 of the rod-shaped radiation heat blocking tube 33 included in the radiation heat blocking tube transporting device. The refractory 9 is in the shape of a cylinder in which the lower end is closed with the bottom 9c and the upper portion is opened. The high frequency coil 11 is wound around from the lower end portion of the refractory 9 up to the position higher than the position of the outer perimeter surface of the refractory 9, in accordance with the upper end portion of the crucible 1 in order to heat the entire crucible 1. The crucible 1 is filled in with a melt 25 serving as a material for a single crystal to such an extent that the liquid level reaches a position somewhat lower than the upper end of the crucible 1.

The radiation heat blocking tube 33 is formed from a nonmetallic material, e.g., the same material as the crystal material, and as shown in FIG. 6, is in the shape of a short tube having the inner diameter larger than or equal to the diameter of a straight body portion of a product single crystal. The crystal transporting device is composed of, for example, the seed holder 17 and a transporting mechanism, although not shown in the drawing, for transporting the seed holder 17 in a vertical direction. Likewise, the in-crucible radiation heat blocking member transporting device is composed of, for example, the support member 35 and a transporting mechanism, although not shown in the drawing, for transporting the support member 35 in a vertical direction.

The operation of the apparatus for producing a single crystal having such a configuration and characteristic portions of the present invention will be described. High-frequency waves are generated in the vicinity of the crucible 1 by energizing the high-frequency coil 11, and the crucible 1 made of a metal generates heat. The temperature of the crucible 1 is increased and, therefore, the temperature of the melt 25 of the crystal material is increased. The lower end portion of the seed crystal 13 is brought into contact with the melt 25, and the melt 25 brought into contact with the seed crystal 13 is cooled by heat conduction via the seed crystal 13 and the seed holder 17. Since the temperature of the seed crystal 13 is lower than or equal to the melting point of the crystal material, a fresh crystal, i.e. a single crystal 15, grows on the surface of the seed crystal 13 in contact with the melt 25. As the fresh crystal grows, the seed crystal 13 is pulled up toward an upper portion with the seed holder 17. The heat is dissipated from the surfaces of the seed crystal 13 and the single crystal 15 toward the ceiling portion of the vessel 19 and the inner surface of the refractory 9 by the radiative transfer, and cooling is performed by the heat conduction via the seed crystal 13 and the seed holder 17, so that the temperature of the single crystal 15 becomes lower than or equal to the melting point of the crystal material. Consequently, a fresh crystal grows on the surface of the single crystal 15 in contact with the melt 25.

As shown in FIG. 5, during the formation of a taper portion in an initial stage of growth of the single crystal, a taper portion 15a in the shape of a conically divergent taper is formed on the surface of the upper portion of the single crystal 15 in order that the diameter of the seed crystal 15 is gradually increased. At this stage, in order to prevent the taper surface of the taper portion 15a from directly facing the crucible inner surface 37 located higher than the liquid level of the melt 25, the radiation heat blocking tube 33 is transported concentrically with the seed crystal 13 and the seed holder 17, and disposed at the position in between the crucible inner surface 37 and the taper surface of the taper portion 15a of the single crystal 15. The length of the radiation heat blocking tube 33 in the axis direction is set at a length that can prevent the radiation heat from the crucible inner surface 37 from reaching the taper surface of the taper portion 15a, from the highest portion of the taper surface of the taper portion 15a to the lowest portion of the taper surface of the taper portion 15a, even when the liquid level of the melt 25 reaches the lowest level during the formation of the taper portion.

The heat generation of the crucible 1 occurs in both the portion in contact with the melt 25 and the portion located higher than the melt 25. However, during the formation of the taper portion shown in FIG. 5, since the radiation heat from the crucible inner surface 37 at a high temperature to the taper surface of the taper portion 15a is blocked by the radiation heat blocking tube 33, the taper surface of the taper portion 15a can be maintained at a low temperature and, therefore, the surface roughening of the taper surface due to thermal etching does not occur. The radiation heat blocking tube 33 is made of a nonmetallic material and, therefore, is not susceptible to high-frequency heating.

When the diameter of the single crystal 15 is increased and reaches a predetermined size, as shown in FIG. 7, the formation of the taper portion 15a is terminated, and the formation of the straight body portion is performed. In the formation of the straight body portion, the single crystal is long-formed into the shape of a cylinder and, thereby, the straight body portion 15b is formed. At this time, the radiation heat blocking tube 33 is isolated from the crucible 1 and the single crystal 15, and is transported to the upper portion of the vessel 19, so that the outer perimeter surface of the straight body portion 15b of the single crystal 15 directly faces the crucible inner surface 37.

As shown in FIG. 7, since the radiation heat blocking tube 33 is transported to the upper portion when the formation of the straight body portion is started, the outer perimeter surface of the straight body portion 15b of the single crystal 15 directly faces the crucible inner surface 37 at a high temperature, and is heated by the radiation heat of the crucible inner surface 37. Since the amount of heating thereof cancels the amount of heat dissipated from the outer perimeter surface of the straight body portion 15b of the single crystal 15 to the ceiling portion of the vessel 19 and the refractory 9, the temperature difference in the radius direction of the single crystal 15 is reduced, and a crystal grows uniformly on the surface 15c of the single crystal 15 in contact with the melt 25. During the formation of the straight body portion, since the heat dissipated from a crystal portion located above the crucible 1, i.e. the taper surface of the taper portion 15a, is large, even when a portion of the outer perimeter surface of the straight body portion 15b of the single crystal 15 is located in the crucible and directly faces the crucible inner surface 37, a high temperature does not result, and the surface roughening due to thermal etching does not occur on the outer perimeter surface of the straight body portion 15b. By these actions, the fraction defective can be reduced without occurrence of fractures, i.e. cracks, or the like, and a single crystal having an improved quality can grow.

The effect of the present embodiment was calculated by numerical simulations. The temperature change was calculated depending on the presence or absence of the radiation heat blocking tube 33 serving as the in-crucible radiation heat blocking member in the formation of the taper portion, as in the present embodiment shown in FIG. 5 and FIG. 7, under the calculation condition that the crystal material was $Gd_2SiO_5$ having a melting point of 1,950° C. The temperature of the crystal growth surface of the lower portion of the crystal is assumed to be the melting point of 1,950° C. As a result of the calculation, when the radiation heat blocking tube 33 is disposed during the formation of the taper portion, as shown in FIG. 5, the temperature of the taper surface of the taper portion 15a becomes about 1,730° C. At this time, the reflectance of the radiation heat blocking tube 33 is assumed to be 1.0. Provided that the radiation heat blocking tube 33 is not disposed, the temperature of the taper surface of the taper portion 15a becomes about 1,780° C. Therefore, the presence or absence of the radiation heat blocking tube, i.e. the in-crucible radiation heat blocking member, results in the difference in the temperature of the taper surface on the order of 50° C.

As described above, according to the technology of producing a single crystal of the present embodiment, the taper surface temperature can be lowered during the formation of the taper portion, roughening of the surface thereof due to thermal etching can be reduced, and the occurrence of defects, cracks, and the like originated in the taper surface can be reduced. Consequently, the fraction defective can be reduced in the production of the single crystal.

Furthermore, in the present embodiment, growth can be performed uniformly in a crystal surface during the formation of the straight body portion of the crystal, and the growth rate can be increased. In addition, the present invention also exhibits the effect of improving the controllability of the crystal growth.

Fourth Embodiment

Figure 8:
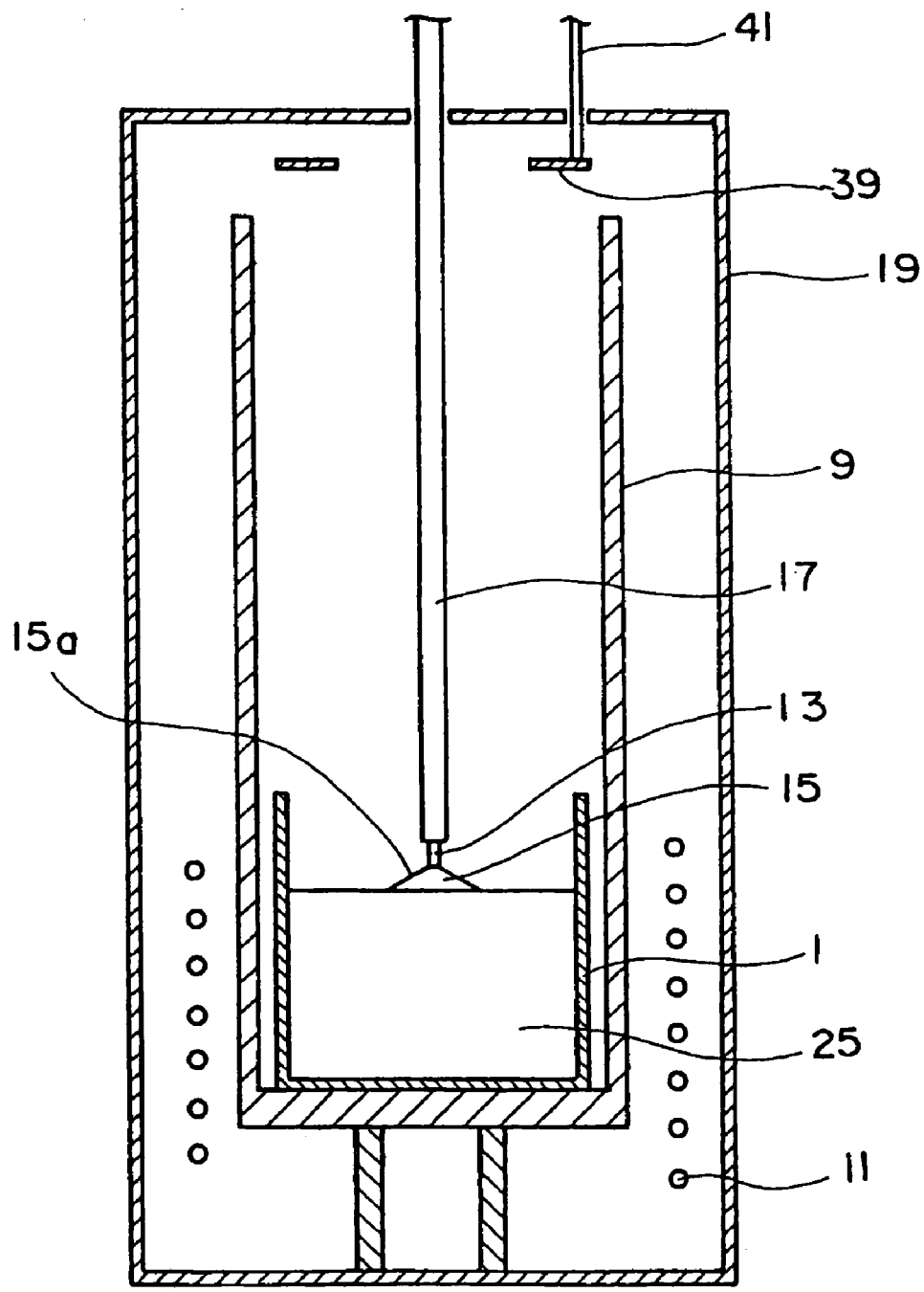
FIG. 8 is a vertical sectional view showing the schematic configuration of a fourth embodiment of the apparatus for producing a single crystal, according to the present invention, under the condition of forming a taper portion in a formation process.
Figure 9:
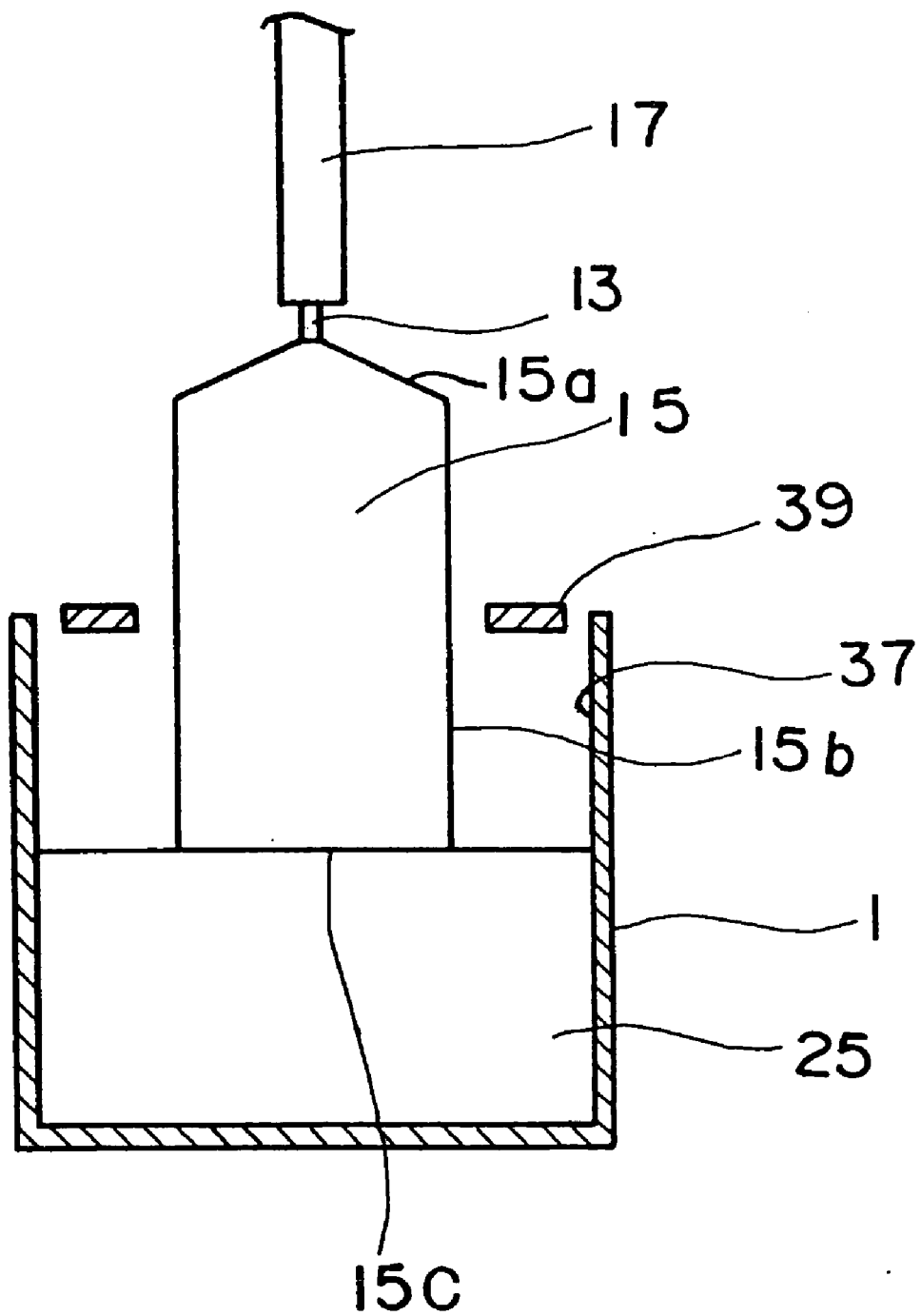
FIG. 9 is a vertical sectional view showing the condition in the vicinity of a crucible during formation of a straight body portion in the fourth embodiment.

The fourth embodiment of the technology of producing a single crystal, according to the present invention, will be described below with reference to FIG. 8 and FIG. 9. FIG. 8 is a vertical sectional view showing the schematic configuration of the apparatus for producing a single crystal, according to the present invention, under the condition of forming a taper portion in a formation process. FIG. 9 is a vertical sectional view showing the condition in the vicinity of a crucible during formation of a straight body portion in the present embodiment. In the present embodiment, the same elements and operations as those in the third embodiment are indicated by the same reference numerals as in the third embodiment, explanations thereof will not be provided, and configurations, characteristic portions, and the like different from those in the third embodiment will be described.

The present embodiment is different from the third embodiment in the point that a ring-shaped straight body portion radiation heat blocking member made of the same metallic material as that of a crucible and a straight body portion radiation heat blocking member transporting device for transporting the straight body portion radiation heat blocking member along the center line of a refractory in a vertical direction are disposed in place of the radiation heat blocking tube transporting device and the radiation heat blocking tube. As shown in FIG. 8, an apparatus for producing a single crystal, according to the present embodiment, is provided with, for example, a radiation heat shielding plate 39 serving as the ring-shaped straight body portion radiation heat blocking member made of the same metallic material as that of a crucible 1 and the straight body portion radiation heat blocking member transporting device for transporting the radiation heat shielding plate 39 along the center line of a refractory 9 in a vertical direction.

The straight body portion radiation heat blocking member transporting device is composed of, for example, a rod-shaped support member 41 for supporting the radiation heat shielding plate 39 and a transporting mechanism, although not shown in the drawing, for transporting the support member 41 in the vertical direction. An entire high-frequency coil 11 is lowered downwards compared with that in the third embodiment in order that an upper end portion thereof becomes lower than an upper end portion of the crucible 1 and, therefore, the amount of heating of the portion located higher than the liquid level of a melt 25 in the crucible 1 is smaller than that in the third embodiment.

The radiation heat shielding plate 39 is located at the position higher than the upper end of the refractory 9 during the formation of the taper portion of the single crystal 15, and is located around the single crystal in an upper portion of the crucible 1 during the formation of the straight body portion of the single crystal 15. The radiation heat shielding plate 39 has an outer diameter substantially equal to or smaller than the inner diameter of the crucible 1 and an inner diameter slightly larger than the outer diameter of the straight body portion 15b of the formed single crystal 15.

The crucible 1 is heated by energizing the high-frequency coil 11. However, with respect to this heating, since the entire high-frequency coil 11 is lowered downwards compared with that in the third embodiment, the amount of heating of the portion located higher than the liquid level of the melt 25 in the crucible 1 becomes small. In the present embodiment, as shown in FIG. 8, during the formation of the taper portion of the single crystal 15, the radiation heat shielding plate 39 is transported above the upper portion in the vessel 19 and the upper end of the refractory 9 by the straight body portion radiation heat blocking member transporting device including the support member 41.

Thus, during the formation of the taper portion, since the radiation heat shielding plate 39 is not present, the heat is dissipated toward an upper portion from the taper surface of the taper portion 15a of the single crystal 15 and, thereby, the taper surface of the taper portion 15a can be maintained at a lower temperature. Although the taper surface of the taper portion 15a directly faces the inner surface of the crucible 1, since the amount of heating of the portion located higher than the liquid level of the melt 25 in the crucible 1 by the high-frequency coil 11 is reduced, the amount of heating is smaller than the amount of heat dissipated from the taper surface of the taper portion 15a, the taper surface of the taper portion 15a is maintained at a low temperature, and roughening of the surface due to a high temperature can be avoided.

After the formation of the taper surface of the taper portion 15a is completed, as shown in FIG. 9, in the process of forming the straight body portion, the radiation heat shielding plate 39 is lowered downwards from the position shown in FIG. 8, and is disposed around the straight body portion 15b of the single crystal 15 in the upper portion of the crucible 1 in order to block the space between the upper end of the crucible 1 and the outer perimeter surface of the straight body portion 15b of the single crystal 15. Consequently, the heat dissipation from the outer perimeter surface of the straight body portion 15b of the single crystal 15 in the inside of the crucible 1 is reduced, the temperature difference in the radius direction of the single crystal 15 is reduced, the occurrence of defects, cracks, and the like is reduced, and the fraction defective is reduced in the production of the single crystal.

Furthermore, a crystal grows uniformly all over the surface 15c of the single crystal 15 in contact with the melt 25. In addition, since no member blocks the heat dissipation from the taper surface of the taper portion 15a, the cooling rate of the crystal growth surface is increased, and a large crystal growth rate can be maintained. Since the radiation heat shielding plate 39 is made of a metal, the temperature of the radiation heat shielding plate 39 is increased by high-frequency heating and, therefore, there is the effect of heating the inside of the crucible 1.

In FIG. 9, the radiation heat shielding plate 39 is disposed around the straight body portion 15b of the single crystal 15 in the upper portion of the crucible 1 in order to block the space between the upper end of the crucible 1 and the outer perimeter surface of the straight body portion 15b of the single crystal 15, and this position is desirable because suppression of the heat dissipation from the outer perimeter surface of the straight body portion 15b is maximized. However, even when the radiation heat shielding plate 39 is further lowered and is disposed at the position in the inside of the crucible 1, the temperature drop of the outer perimeter surface of the straight body portion 15b at the position close to the liquid level of the melt 25 can be suppressed and, therefore, substantially the same effect as that in the case where the position is as shown in FIG. 9 can be exhibited.

A similar effect can also be exhibited when the radiation heat shielding plate 39 is made from a ring-shaped member having an inner diameter larger than the outer diameter of the straight body portion 15b of the single crystal 15 and smaller than the inner diameter of the crucible 1 and an outer diameter larger than the outer diameter of the crucible 1, and such a radiation heat shielding plate is located at the position close to the upper end portion of the crucible 1 during the formation of the single crystal straight body portion and is transported to the position some distance above the upper end portion of the crucible 1 during the formation of the taper portion of the single crystal 15.

Fifth Embodiment

Figure 10:
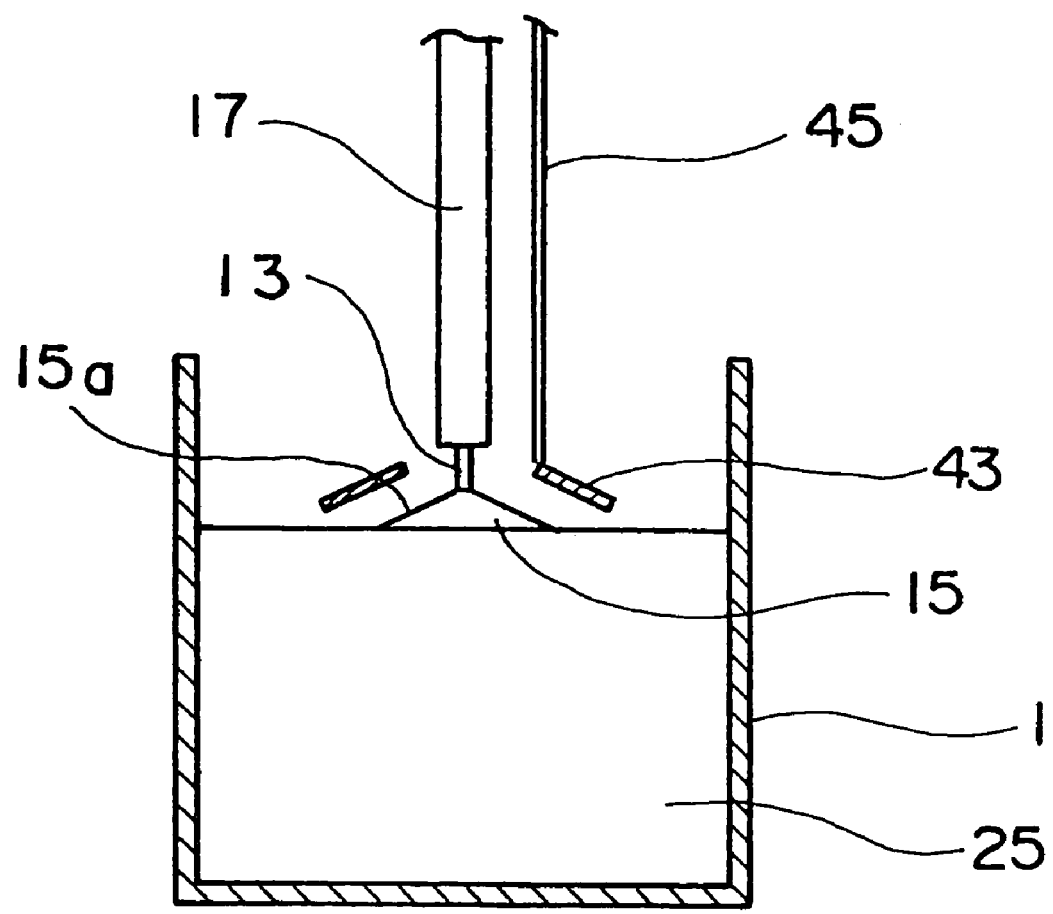
FIG. 10 is a vertical sectional view of the vicinity of a crucible, showing the schematic configuration of a fifth embodiment of the apparatus for producing a single crystal, according to the present invention, under the condition of forming a taper portion in a formation process.
Figure 11:
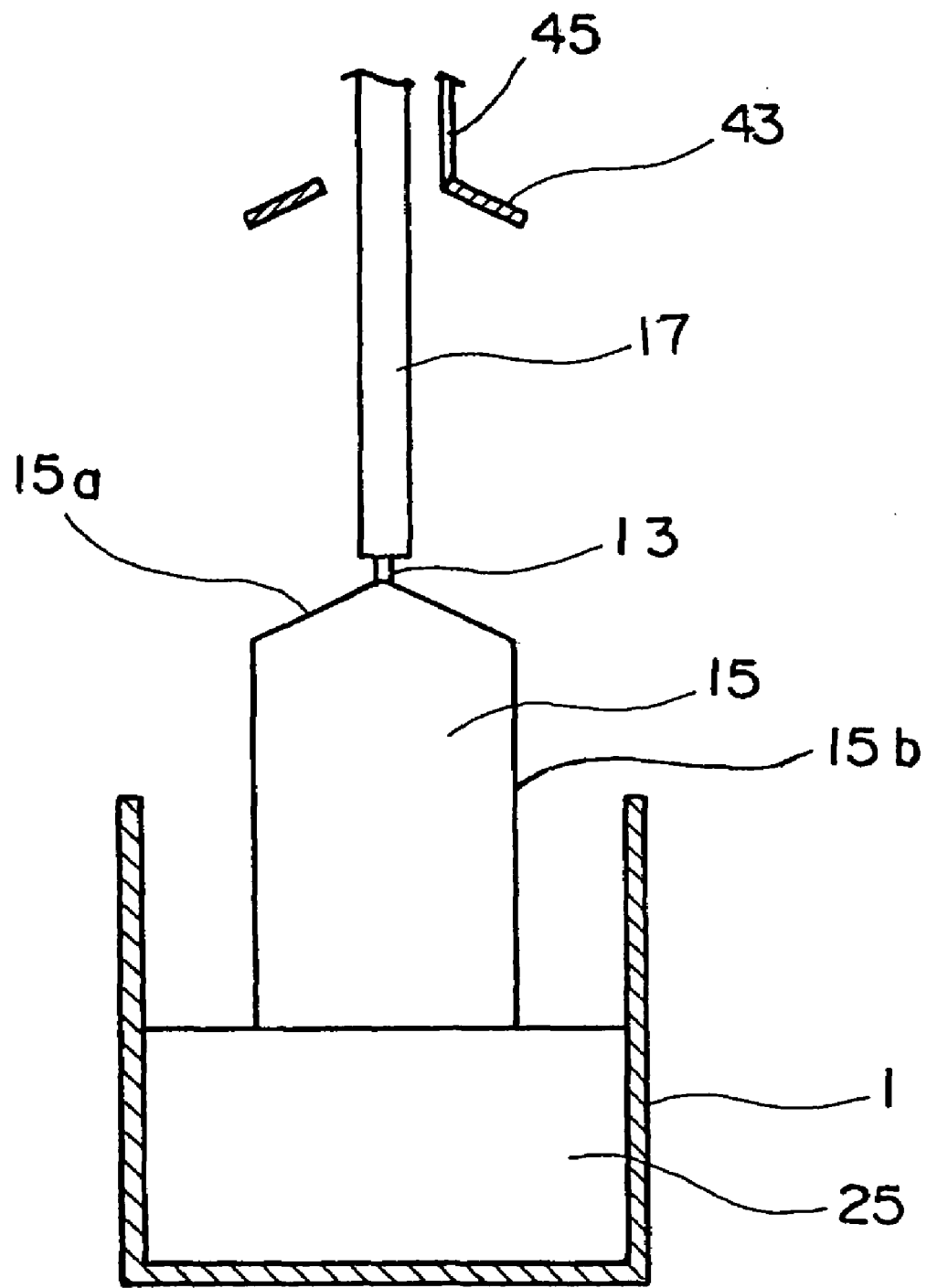
FIG. 11 is a vertical sectional view of the vicinity of a crucible showing the schematic configuration of a fifth embodiment of the apparatus for producing a single crystal, according to the present invention, under the condition of a straight body portion in a formation process.

The fifth embodiment of the technology of producing a single crystal, according to the present invention, will be described below with reference to FIG. 10 and FIG. 11. FIG. 10 and FIG. 11 are vertical sectional views of the vicinity of a crucible showing the schematic configuration of the apparatus for producing a single. crystal, according to the present invention, in a formation process. In the present embodiment, the same elements and operations as those in the third and the fourth embodiments are indicated by the same reference numerals as in the above-described embodiments, explanations thereof will not be provided, and configurations, characteristic portions, and the like different from those in the third and the fourth embodiments will be described.

The present embodiment is different from the third embodiment in the point that an in-crucible radiation heat blocking member made of a nonmetallic material in the shape of a cone along the tapered shape of the taper portion of the single crystal and an in-crucible radiation heat blocking member transporting device for transporting the in-crucible radiation heat blocking member along the center line of a refractory in a vertical direction are disposed in place of the radiation heat blocking tube 33 and the radiation heat blocking tube transporting device shown in FIG. 5. As shown in FIG. 10, an apparatus for producing a single crystal, according to the present embodiment, is provided with a radiation heat shielding plate 43 serving as the in-crucible radiation heat blocking member made of a nonmetallic material in the shape of a cone along the tapered shape of the taper portion 15a of the single crystal 15 and the in-crucible radiation heat blocking member transporting device which includes a rod-shaped support member 45 for supporting the radiation heat shielding plate 43 and which transports the radiation heat shielding plate 43 along the center line of a refractory 9 in a vertical direction. The in-crucible radiation heat blocking member transporting device is composed of, for example, a rod-shaped support member 45 which supports the radiation heat shielding plate 43 and which is extended in a vertical direction and a transporting mechanism, although not shown in the drawing, for transporting the support member 45 in the vertical direction.

In the present embodiment, as shown in FIG. 10, during the formation of the taper portion of the single crystal 15, the radiation heat shielding plate 43 is positioned close to the taper surface of the taper portion 15a of the single crystal 15. The angle of inclination of the conical surface of the radiation heat shielding plate 43 is substantially equal to the angle of inclination of the taper surface of the taper portion 15a. As shown in FIG. 11, during the formation of the straight body portion of the single crystal 15, the radiation heat shielding plate 43 is transported to the position a distance from the taper surface of the taper portion 15a of the single crystal 15.

The operation of the above-described radiation heat shielding plate 43 of the present embodiment is similar to the operation of the radiation heat blocking tube 33 in the third embodiment. The radiation heat shielding plate 43 is disposed close to the taper surface of the taper portion 15a of the single crystal 15 during the formation of the taper portion of the single crystal 15, and the radiation heat shielding plate 43 is transported to the position a distance from the taper surface of the taper portion 15a of the single crystal 15 during the formation of the straight body portion of the single crystal 15.

In the present embodiment, since the angle of inclination of the conical surface of the radiation heat shielding plate 43 is substantially equal to the angle of inclination of the taper surface of the taper portion 15a, the taper portion 15a is formed during the formation of the taper portion while the spacing between the taper surface of the taper portion 15a and the radiation heat shielding plate 43 is constant at any position on the taper surface of the taper portion 15a. Consequently, the entire surface of the taper surface of the taper portion 15a can be formed uniformly, an origin of crack, i.e., fracture, is resistant to occur, and the fraction defective can be reduced in the production of the single crystal.

In addition, since the radiation heat shielding plate 43 is not located at the position close to the taper surface of the taper portion 15a during the formation of the straight body portion, the heat dissipation from the taper surface of the taper portion 15a can be increased and, thereby, the growth rate can be increased.

Therefore, according to the present embodiment as well, the effects similar to those in the other embodiments can be exhibited.

The effect of preventing the surface roughening can be exhibited even when not only the conical plate shown in FIG. 10, but also a flat disk is used as the radiation heat shielding plate 43. However, it is desirable to use a conical plate in accordance with the inclination of the taper surface of the taper portion to be formed.

Sixth Embodiment

Figure 12:
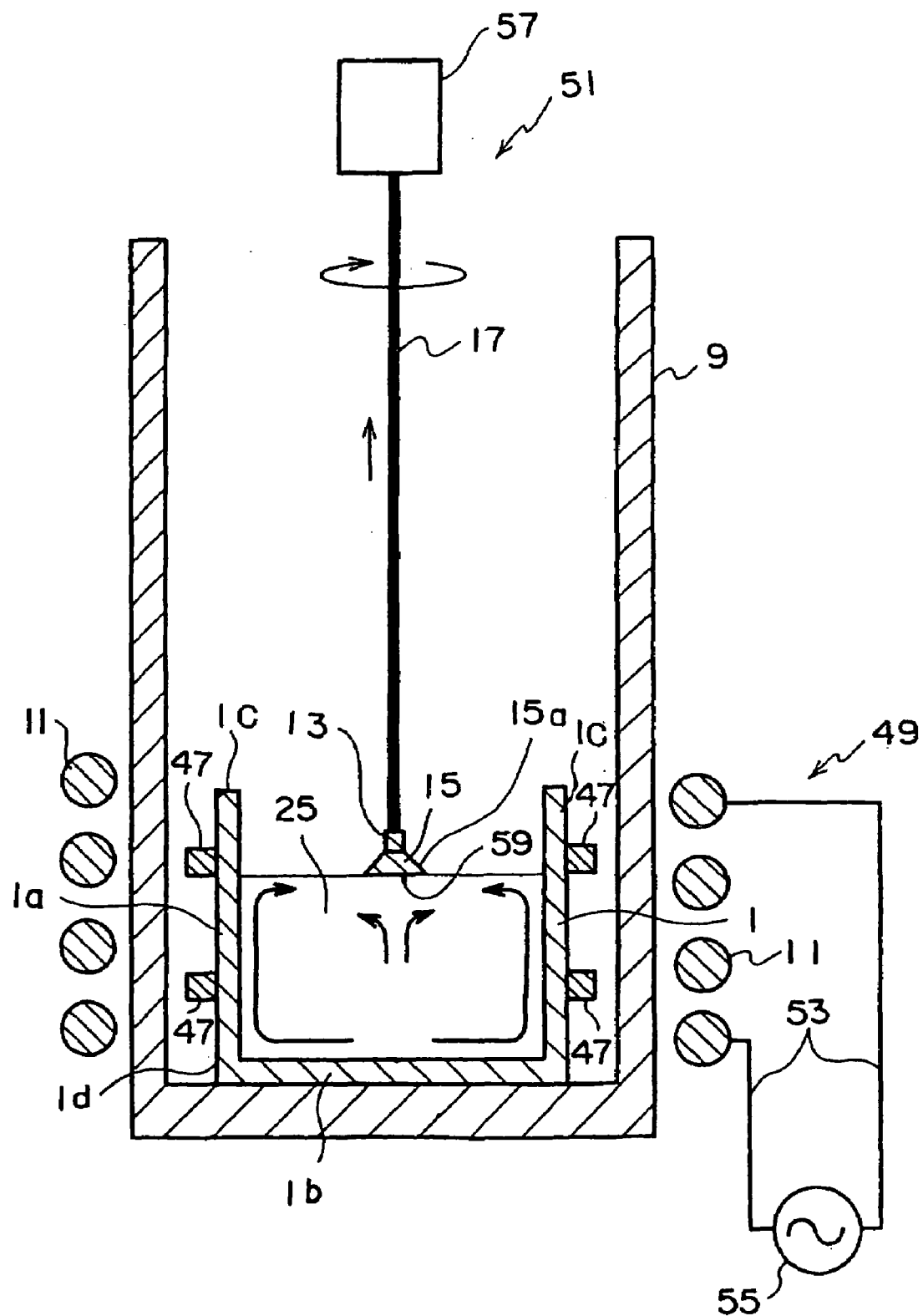
FIG. 12 is a vertical sectional view showing the schematic configuration and the operation of a sixth embodiment of the apparatus for producing a single crystal, according to the present invention, in a stage of formation of a taper portion of a single crystal.
Figure 13:
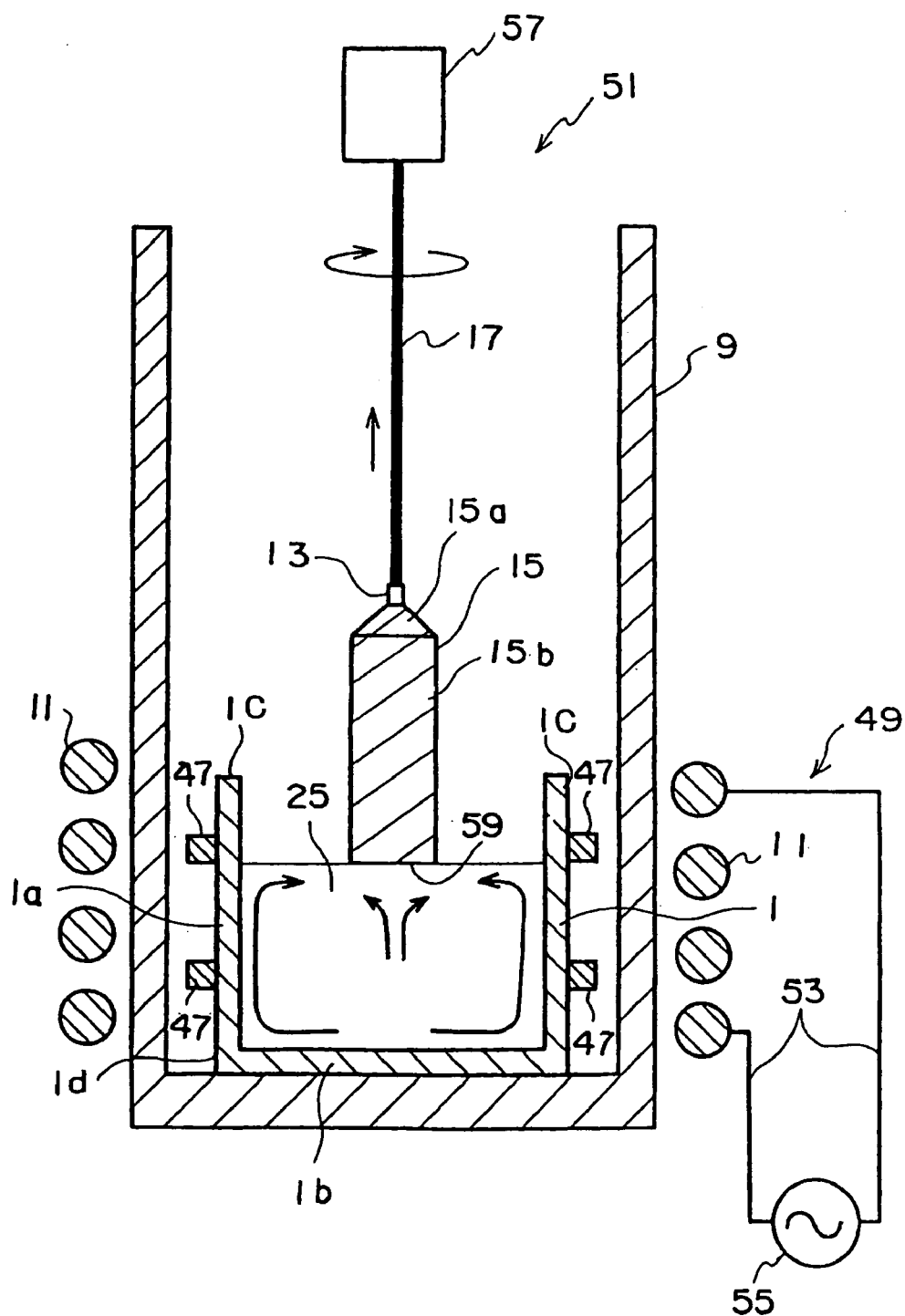
FIG. 13 is a vertical sectional view showing the schematic configuration and the operation of the sixth embodiment of the apparatus for producing a single crystal, according to the present invention, in a stage of formation of a straight body portion of the single crystal.
Figure 14:
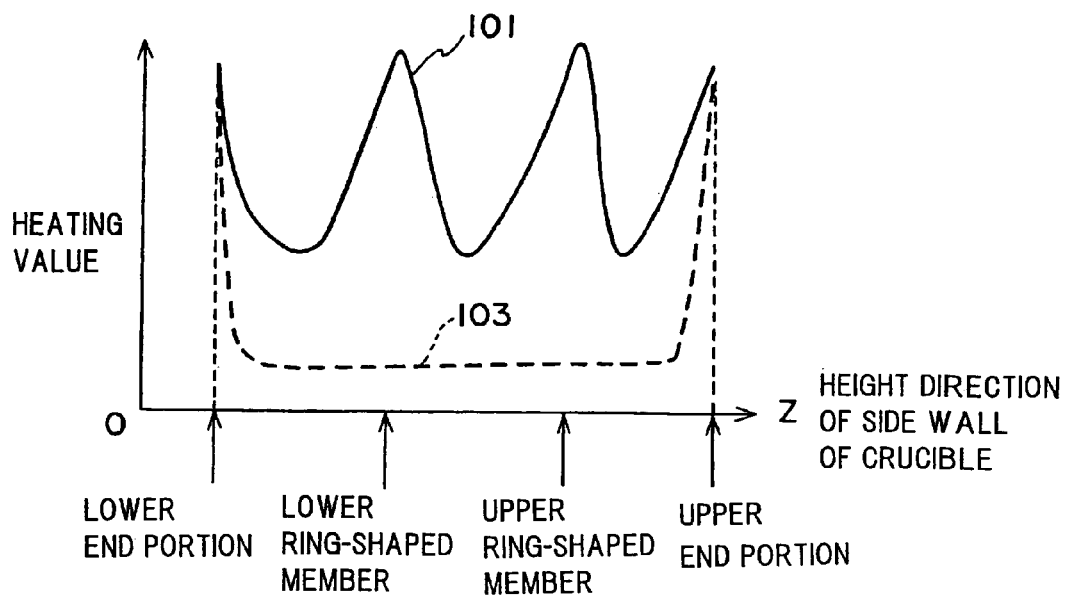
FIG. 14 shows a comparison of distributions of heating values in the height direction of side walls of the apparatus for producing a single crystal of the sixth embodiment and a known apparatus for producing a single crystal.
Figure 15:
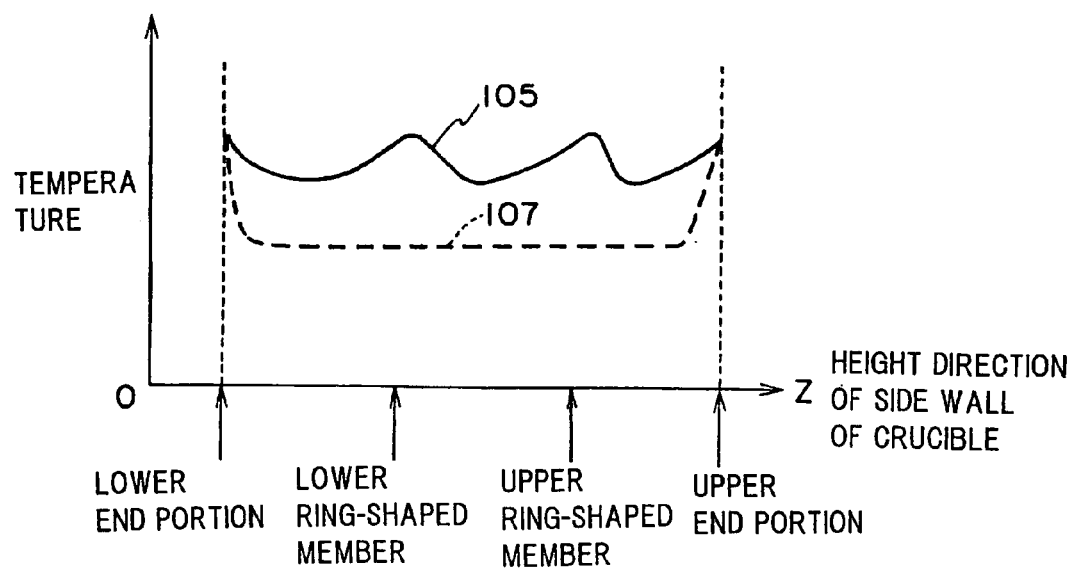
FIG. 15 shows a comparison of temperature distributions in the height direction of side walls of the apparatus for producing a single crystal of the sixth embodiment and a known apparatus for producing a single crystal.

The sixth embodiment of the apparatus for producing a single crystal, according to the present invention, will be described with reference to FIG. 12 to FIG. 15. FIG. 12 is a vertical sectional view showing the schematic configuration and the operation of an apparatus for producing a single crystal, according to the present invention, in a stage of formation of a taper portion of a single crystal. FIG. 13 is a vertical sectional view showing the schematic configuration and the operation of the apparatus for producing a single crystal, according to the present invention, in a stage of formation of a straight body portion of the single crystal. FIG. 14 shows a comparison of distributions of heating value s in the height direction of side walls of the apparatus for producing a single crystal, according to the present invention, and a known apparatus for producing a single crystal. FIG. 15 shows a comparison of temperature distributions in the height direction of side walls of the apparatus for producing a single crystal, according to the present invention, and a known apparatus for producing a single crystal. In the present embodiment, the same elements, operations, and the like as those in the first to the fifth embodiments are indicated by the same reference numerals as in the above-described embodiments.

As shown in FIG. 12, an apparatus for producing a single crystal, according to the present embodiment, is composed of, for example, a cylindrical crucible 1, ring-shaped members 47 which are attached to an outer surface of the side wall of the crucible 1 and which serve as side wall heating members, a refractory 9 surrounding the crucible 1, high-frequency generation device 49 which generates high frequencies in the outside of the refractory 9, and crystal transporting device 51 which holds a seed crystal and which rotates and pulls up a crystal.

The apparatus for producing a single crystal of the present embodiment is an apparatus for producing a single crystal having a melting point of at least 1,500° C. The crucible 1 is a cylindrical vessel in which the upper end portion 1*c* is opened and the lower end portion 1*d* is blocked to form a bottom 1*b*, and which is formed from an electrically conductive, high-melting point metallic material, e.g., iridium, platinum, tungsten, or molybdenum. The ring-shaped members 47 are disposed in the shape of a ring on the outer surface of the side wall 1*a* of the crucible 1 along the circumferential direction of this outer surface of the side wall 1*a*, and are protrusion-shaped members in the condition of protruding in a lateral direction from the outer surface of the side wall 1*a*.

The above-described ring-shaped member 47 is formed from an electrically conductive, high-melting point metallic material, e.g., iridium, platinum, tungsten, or molybdenum, similarly to the crucible 1. The ring-shaped members 47 can be formed integrally with the crucible 1, or be formed separately from the crucible 1, followed by being attached to the side wall of the crucible 1. When the ring-shaped member 47 is formed separately from the crucible 1, the ring-shaped member 47 may be formed from the same material as the material for forming the crucible 1, or be formed from a different material. When the ring-shaped member 47 is formed separately from the crucible 1, it is desirable that the ring-shaped member 47 is attached while being in contact with the crucible 1 as strong as possible. In the present embodiment, ring-shaped members 47 are disposed on two portions with a spacing, in between an upper end portion 1*c* and a lower end portion 1*d* of the outer surface of the side wall 1*a* of the crucible 1.

The refractory 9 is a cylindrical vessel in which the upper end portion is opened and the lower end portion is blocked to form a bottom and which is larger than the crucible 1. The refractory 9 is formed from a high-temperature resistant material, e.g., zirconia or alumina, having an electrical insulation property and a heat insulation property, and contains the crucible 1 provided with the ring-shaped members 47, in the inside. The high-frequency generation device 49 is composed of, for example, a high-frequency coil 11 and a high-frequency power source 55 electrically connected to the high-frequency coil 11 via wires 53. The high-frequency coil 11 is disposed outside the refractory 9 at the position in accordance with the side wall 1*a* of the crucible 1 and surrounds the outside of this refractory 9. The crystal transporting device 51 is composed of, for example, a rod-shaped or band-shaped seed holder 17 and a driving mechanism 57 for hanging the seed holder 17 and for rotating and pulling up the seed holder 17. The driving mechanism 57 supports the seed holder 17 while the seed holder 17 is hung from above an opening in an upper end portion of the refractory 9 toward a central portion of an opening of the crucible 1, and the seed crystal 13 is attached to the end portion in the crucible 1 side of the seed holder 17.

The operation of the apparatus for producing a single crystal having such a configuration and characteristic portions of the present invention will be described. When a high-frequency current is passed from the high-frequency power source 55 through the high-frequency coil 11 while a raw material is held in the crucible 1, an induced current passes through the electrically conductive crucible 1. In this manner, the crucible 1 is heated by Joule heating, the temperature of the crucible 1 is raised, the raw material in the crucible 1 is melted and becomes in a molten state, so that a melt 25 is prepared. When the seed crystal 13 attached to the end portion of the seed holder 17 is pulled up from the melt 25, the single crystal 15 is formed. In the formation of the single crystal 15, initially, a taper portion 15*a* is formed into the shape of a cone connecting with the seed crystal 13 and, as shown in FIG. 13, a cylindrical straight body portion 15*b* is formed connecting with the taper portion 15*a*. When the single crystal 15 is pulled up from the melt 25, in order to create a flow from the single crystal 15 toward the inner surface of the side wall 1*a* of the crucible 1, i.e. a flow spreading from the position of the single crystal 15 toward the radius direction, in the vicinity of the liquid level of the melt 25, the seed holder 17 is rotated as a rotation axis and, thereby, the single crystal 15 is rotated.

Since an electromagnetic field generated by the high-frequency coil 11 particularly concentrates on a corner portion, the upper end portion 1*c* and the lower end portion 1*d* of the crucible 1 generate a larger amount of heat compared with the other portions. Furthermore, in the present embodiment, the ring-shaped members 47 disposed in between the upper end portion 1*c* and the lower end portion 1*d* on the outer surface of the side wall 1*a* of the crucible 1 also generate a larger amount of heat compared with the other portions, similarly to the upper end portion 1*c* and the lower end portion 1*d* of the crucible 1.

Consequently, as is clear from the heating value distribution 101 indicated by a solid line shown in FIG. 14, in the distribution of the heating value of the side wall 1*a* per unit volume, peaks are observed at a periphery of the bottom 1*b* of the side wall 1*a*, i.e. the lower end portion 1*d*, a portion at which the ring-shaped member 47 positioned in the lower side is disposed, a portion at which the ring-shaped member 47 positioned in the upper side is disposed, and the upper end portion 1*c* of the side wall 1*a*, in that order from the bottom 1*b* of the crucible 1 toward the upper end portion 1*c*, i.e. toward the height direction. As a result, in the temperature distribution of the side wall 1*a* of the crucible 1, as is clear from the temperature distribution 105 indicated by a solid line shown in FIG. 15, peaks are observed at a portion of the bottom 1*b* of the side wall 1*a*, the portion at which the ring-shaped member 47 positioned in the lower side is disposed, the portion at which the ring-shaped member 47 positioned in the upper side is disposed, and the upper end portion 1*c* of the side wall 1*a*, in that order from the bottom 1*b* of the crucible 1 toward the upper end portion 1*c*, i.e. toward the height direction.

On the other hand, with respect to a known apparatus for producing a single crystal, provided with no ring-shaped member 47, as is clear from the heating value distribution 103 indicated by a broken line shown in FIG. 14, in the distribution of the heating value of the side wall per unit volume, peaks are observed only at the periphery of the bottom of the side wall, i.e. the lower end portion, and the upper end portion of the side wall, in that order from the bottom of the crucible toward the upper end portion, i.e. toward the height direction. As a result, in the temperature distribution of the side wall of the crucible, as is clear from the temperature distribution 107 indicated by a broken line shown in FIG. 15, peaks are observed only at a periphery of the bottom of the side wall and the upper end portion of the side wall, in that order from the bottom of the crucible toward the upper end portion, i.e. toward the height direction. Thus, in the known apparatus for producing a single crystal, the heating values and the temperatures of the lower end portion and the upper end portion of the side wall become higher than those of the other portions and, therefore, the distributions of the heating value and the temperature are in nonuniform states. As the distance between the lower end portion and the upper end portion of the side wall are increased, the heating value and the temperature of the portion in between the lower end portion and the upper end portion of the side wall are lowered. Consequently, the above-described nonuniform states of the heating value and the temperature become significant particularly when a crucible having a height larger than the diameter of the bottom or a large crucible having a diameter of the bottom and a height of at least several tens of centimeters is used.

Figure 16:
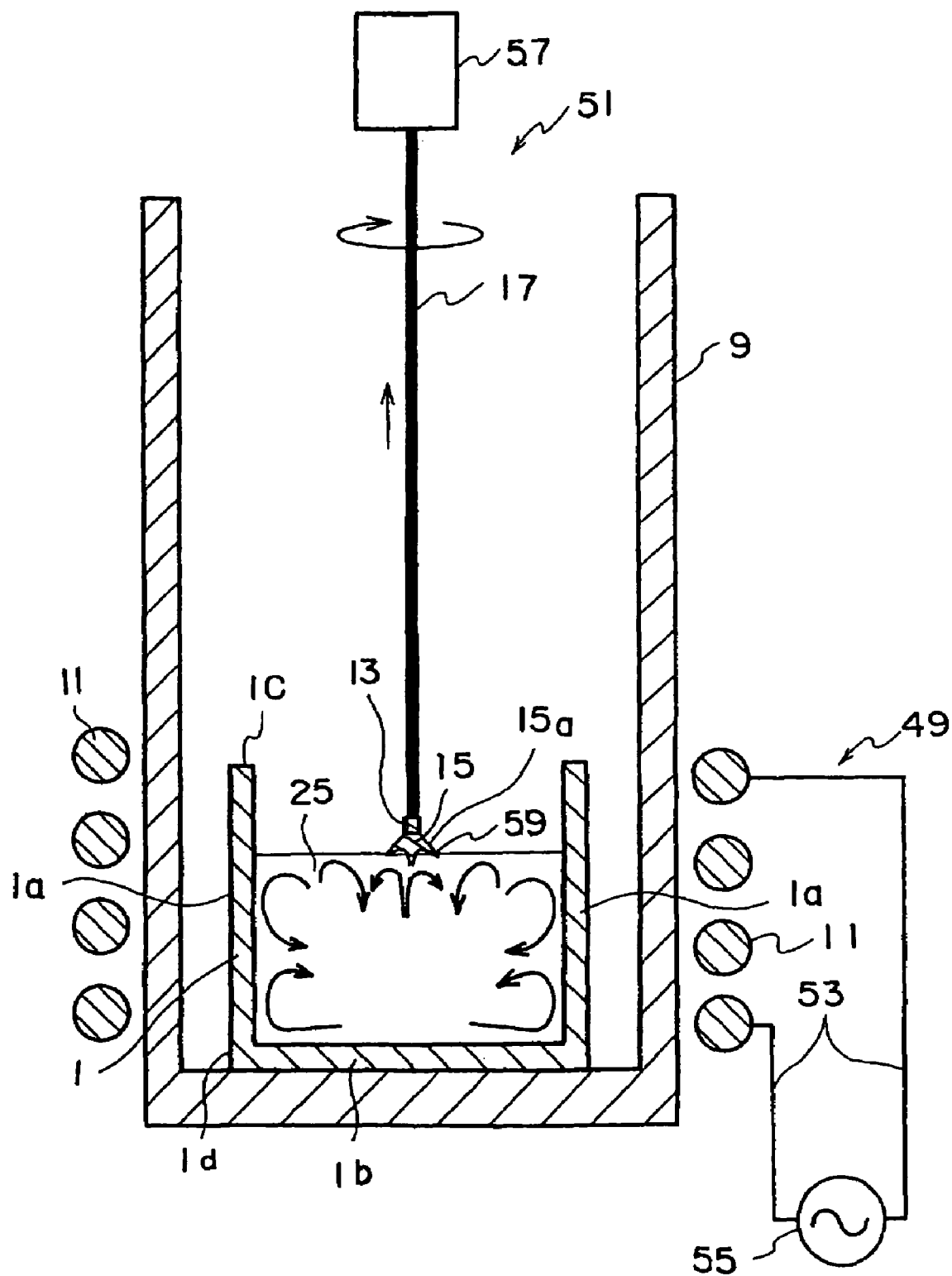
FIG. 16 shows the state of convection of a melt in a crucible in a known apparatus for producing a single crystal.

Therefore, in the known apparatus for producing a single crystal, when the distributions of the heating value and the temperature are nonuniform in the height direction of the side wall 1a and the temperature of the portion in between the lower end portion 1d and the upper end portion 1c of the side wall 1a is low depending on the conditions, e.g., the size and the shape of the crucible, as shown in FIG. 16, the melt 25 in the crucible 1 expands by being heated at the lower end portion 1d of the crucible 1, and initially, rises along the inner surface of the side wall 1a of the crucible 1. However, since the temperature is lowered at the midpoint of the height of the side wall 1a of the crucible 1, the melt 25 flows away from the side wall 1a, and conflicts with a flow of the melt 25 in the upper portion in the crucible 1, so that a complicated convection pattern is exhibited, and the entire flow of the melt 25 in the crucible 1 is disturbed.

In this manner, the shape of the single crystal formation portion, i.e. the solid-liquid interface portion 59, of the single crystal 15 formed connecting with the seed crystal 13 is disturbed and becomes in an uneven state. If the shape of the solid-liquid interface portion 59 of the single crystal 15 is disturbed and becomes in an uneven state, the quality of the single crystal 15 is deteriorated. For example, the temperature distribution of the solid-liquid interface portion 59 of the single crystal 15 and the vicinity thereof become nonuniform and, thereby, distortion occurs in the single crystal 15. When distortion occurs in the single crystal 15, problems of, for example, cracking of the crystal occur during the cooling of the formed single crystal 15.

On the other hand, in the apparatus for producing a single crystal of the present embodiment, the ring-shaped members 47 are disposed on the crucible 1 as described above. Consequently, the heating value of the side wall 1a is increased at the portion provided with the lower ring-shaped member 47 and the portion provided with the upper ring-shaped member 47, in addition to the lower end portion 1d and the upper end portion 1c of the side wall 1a, compared with those at the other portions. Since the heating values of the portion provided with the lower ring-shaped member 47 and the portion provided with the upper ring-shaped member 47 are increased, the heating values of the portions of the side wall 1a other than the lower end portion 1d, the portion provided with the lower ring-shaped member 47, the portion provided with the upper ring-shaped member 47, and the upper end portion 1c are increased compared with those in the known apparatus for producing a single crystal. Therefore, the heating value distribution in the height direction of the side wall is uniformed compared with that in the known apparatus for producing a single crystal.

In this manner, in the apparatus for producing a single crystal of the present embodiment, the temperature of the side wall 1a is increased at the portion provided with the lower ring-shaped member 47 and the portion provided with the upper ring-shaped member 47, in addition to the lower end portion 1d and the upper end portion 1c of the side wall 1a, compared with those at the other portions. Since the temperatures of the portion provided with the lower ring-shaped member 47 and the portion provided with the upper ring-shaped member 47 are increased, the heating values of the portions other than the lower end portion 1d of the side wall 1a, the portion provided with the lower ring-shaped member 47, the portion provided with the upper ring-shaped member 47, and the upper end portion 1c are also increased compared with those in the known apparatus for producing a single crystal. Therefore, the temperature distribution in the height direction of the side wall is uniformed compared with that in the known apparatus for producing a single crystal. When the distributions of the heating value and the temperature are thus uniformed in the height direction of the side wall 1a of the crucible 1, as shown in FIG. 12 and FIG. 13, a flow which rises smoothly along the inner surface of the side wall 1a of the crucible 1 by the natural convection is formed in the melt 25 in the crucible 1. Therefore, an undesirable complicated convection pattern is resistant to be exhibited in contrast to that in the known apparatus for producing a single crystal.

In this manner, since the apparatus for producing a single crystal of the present embodiment is provided with ring-shaped members 47 in between the lower end portion 1d and the upper end portion 1c of the side wall 1a, the lower ring-shaped member 47 and the upper ring-shaped member 47 also generate heat in addition to the lower end portion 1d and the upper end portion 1c of the side wall 1a by driving the high-frequency generation device 49, as described above, so that the temperature distribution in the height direction of the side wall 1a of the crucible 1 is uniformed. Consequently, the distribution of the heat generation in the height direction of the side wall 1a of the crucible 1 can be controlled, the convection of the melt 25 in the crucible 1 can be controlled, and a flow which rises smoothly along the inner surface of the side wall 1a of the crucible 1 by the natural convection can be formed in the melt 25 in the crucible 1, so that the melt 25 in the crucible 1 is resistant to exhibit a previously known undesirable convection pattern. Therefore, the solid-liquid interface portion of the single crystal can be flattened regardless of conditions, e.g., the size and the shape of the crucible, the occurrence of defects, cracks, and the like can be reduced, and the fraction defective can be reduced in the production of the single crystal.

Furthermore, since the solid-liquid interface portion of the single crystal can be flattened, the quality of the produced single crystal can be improved. In addition, since the quality of the produced single crystal can be improved and the occurrence of cracks and the like of the crystal can be suppressed, the productivity of the crystal can be improved.

In the present embodiment, the ring-shaped members 47 are disposed in two stages one above the other. However, the ring-shaped member 47 may be disposed in a single stage, or the ring-shaped members 47 may be disposed in at least three stages. The number of stages of the ring-shaped members 47 to be disposed is appropriately determined in accordance with, for example, the size of the crucible.

In the present embodiment, the ring-shaped members 47 disposed in the circumferential direction of the outer surface of the side wall 1a of the crucible 1 are used as the wall-side heating members. However, the wall-side heating member is not necessarily in the shape of a series of ring and may take various forms as long as the member is extended in the circumferential direction of the outer surface of the side wall 1a. For example, the wall-side heating member can also be composed of, for example, pieces of the member intermittently connected into the shape of a ring at appropriate spacings in the circumferential direction of the outer surface of the side wall 1a of the crucible 1. In this case, the pieces of the member must be made into a shape long-extended in the circumferential direction of the outer surface of the side wall 1a of the crucible 1 compared with that in the height direction of the side wall 1a of the crucible 1, and furthermore, it is desirable that these pieces of the member are disposed equidistantly in order to heat uniformly the side wall of the crucible 1.

Seventh Embodiment

Figure 17:
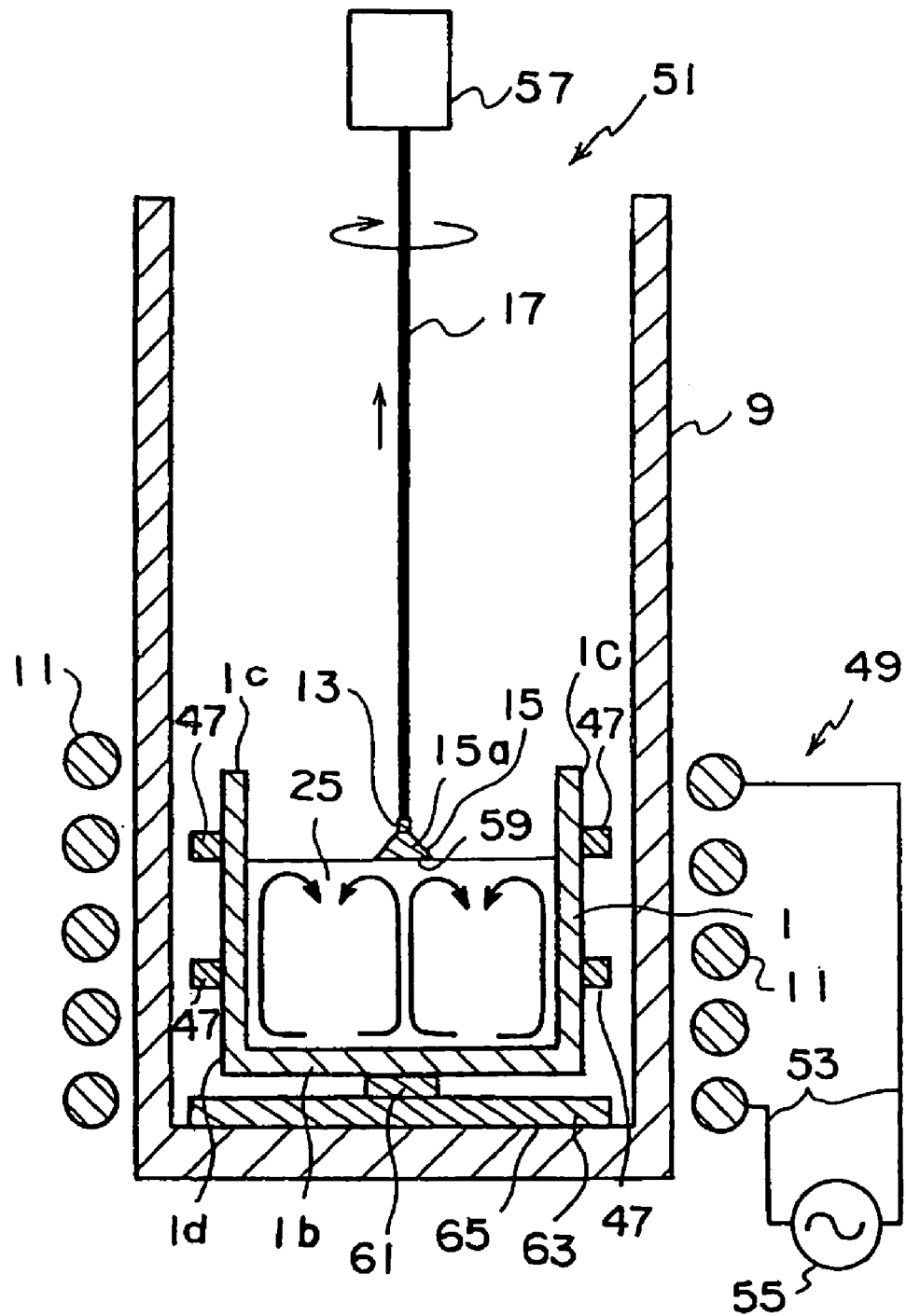
FIG. 17 is a vertical sectional view showing the schematic configuration and the operation of a seventh embodiment of the apparatus for producing a single crystal, according to the present invention, in a stage of formation of a taper portion of a single crystal.
Figure 18:
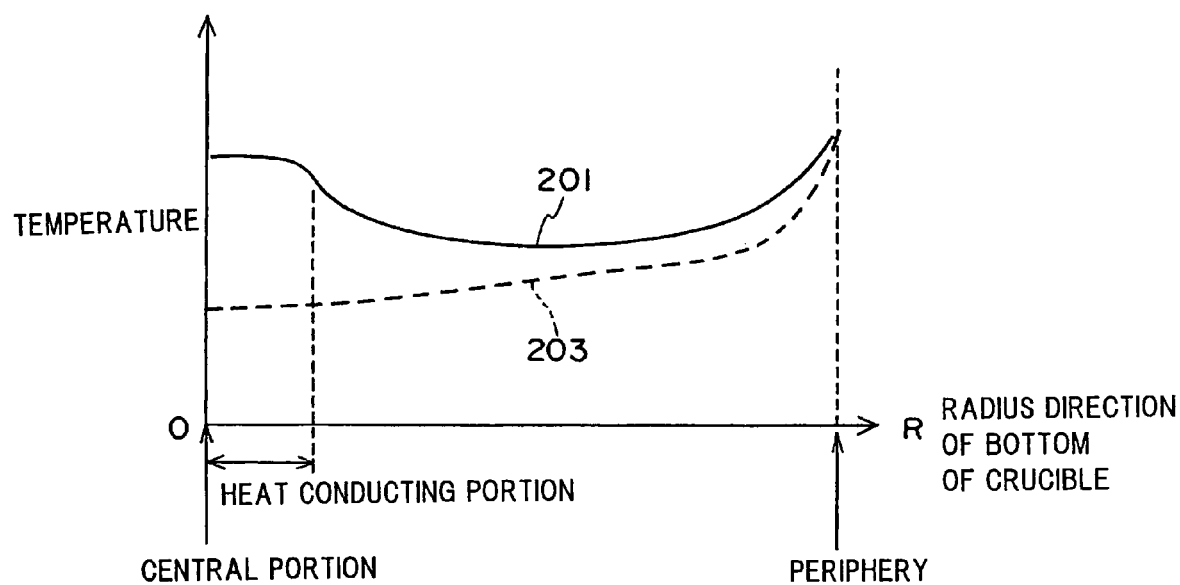
FIG. 18 shows a comparison of temperature distributions of the bottoms of the apparatus for producing a single crystal of the seventh embodiment and a known apparatus for producing a single crystal.

The seventh embodiment of the apparatus of producing a single crystal, according to the present invention, will be described below with reference to FIG. 17 and FIG. 18. FIG. 17 is a sectional view showing the schematic configuration and the operation of the apparatus for producing a single crystal, according to the present invention, in a stage of formation of a taper portion of a single crystal. FIG. 18 shows a comparison of temperature distributions of the bottoms of the apparatus for producing a single crystal, according to the present invention, and a known apparatus for producing a single crystal. In the present embodiment, the same elements and operations as those in the sixth embodiment are indicated by the same reference numerals as in the sixth embodiment, explanations thereof will not be provided, and configurations, characteristic portions, and the like different from those in the sixth embodiment will be described.

The apparatus for producing a single crystal of the present embodiment is different from that of the sixth embodiment in the point that a bottom-side heating member for heating a central portion of the bottom of a crucible is disposed in addition to the ring-shaped members serving as wall-side heating member. As shown in FIG. 17, the apparatus for producing a single crystal, according to the present embodiment, is provided with a bottom-side heating member 65 composed of a heat conducting member 61 made of a cylindrical or disk-shaped member disposed at a central portion of the outer surface of the bottom 1b of the crucible 1 and a disk-shaped heat generation portion 63 provided with the heat conducting portion 61 at a central portion. The heat generation portion 63 is formed to have a diameter larger than the diameter of the heat conducting portion 61, and to have a diameter at least two-thirds the diameter of the bottom 1b of the crucible 1. When the diameter of the heat generation portion 63 is thus made to be at least two-thirds the diameter of the bottom 1b of the crucible 1, the heat generation portion 63 tends to generate heat by high-frequency electromagnetic field and, therefore, the heating capacity of the bottom-side heating member 65 can be improved. The bottom-side heating member 65 disposed in the bottom 1b side of the crucible 1 is contained in a refractory 9 together with the crucible 1.

The bottom-side heating member 65 composed of the heat conducting portion 61 and the heat generation portion 63 is formed from an electrically conductive, high-melting point metallic material, e.g., iridium, platinum, tungsten, or molybdenum, similarly to the crucible 1 and the ring-shaped member 47. The bottom-side heating member 65 can be formed integrally with the crucible 1 while being connected with the bottom 1b of the crucible 1, or be formed separately from the crucible 1, followed by being attached to the bottom 1b of the crucible 1. Furthermore, the heat conducting portion 61 and the heat generation portion 63 of the bottom-side heating member 65 can be formed separately from each other. When the bottom-side heating member 65 is formed separately from the crucible 1, the bottom-side heating member 65 can be formed from the same material as the material for forming the crucible 1, or be formed from a different material. When the bottom-side heating member 65 is formed separately from the crucible 1, it is desirable that the bottom-side heating member 65 is attached while the heat conducting portion 61 is in contact with the crucible 1 as strong as possible.

In the apparatus for producing a single crystal of the present embodiment having such a configuration, an electromagnetic field generated by the high-frequency coil 11 concentrates particularly on a corner portion. Consequently, a periphery of the heat generation portion 63 of the bottom-side heating member 65 also generates heat in addition to the periphery of the bottom 1b of the crucible 1, i.e. the lower end portion 1d of the crucible 1. The heat generated from the periphery of the heat generation portion 63 of the bottom-side heating member 65 is conducted from the heat generation portion 63 to the central portion of the bottom 1b of the crucible 1 via the heat conducting portion 61 by heat conduction, and the central portion of the bottom 1b of the crucible 1 is heated. Therefore, in the distribution of the heating value of the bottom 1b per unit volume, a peak is observed at the central portion of the bottom 1b of the crucible 1 in addition to at the periphery of the bottom 1b. As a result, in the temperature distribution of the bottom 1b of the crucible 1, as is clear from the temperature distribution 201 indicated by a solid line shown in FIG. 18, a peak is observed at the central portion of the bottom 1b of the crucible 1 in addition to at the periphery of the bottom 1b.

On the other hand, with respect to a known apparatus for producing a single crystal, provided with no bottom-side heating member 65, in the distribution of the heating value of the bottom per unit volume, a peak is observed only at the periphery of the bottom of the crucible 1. As a result, in the temperature distribution of the bottom of the crucible, as is clear from the temperature distribution 203 indicated by a broken line shown in FIG. 18, a peak is observed only at the periphery of the bottom of the crucible. In the known apparatus for producing a single crystal, the central portion of the crucible is in a condition of being at a lowest temperature. The temperature of the central portion of the bottom of the crucible becomes lower as the diameter of the bottom of the crucible is increased. Therefore, in the known apparatus for producing a single crystal, a melt flow which rises from the central portion of the bottom of the crucible may not be formed depending on the conditions, e.g., the size and the shape of the crucible, and thereby, a melt flow which spreads in the radius direction, from the solid-liquid interface portion of the single crystal toward the inner surface of the side wall of the crucible, may not be formed. Consequently, the shape of the solid-liquid interface portion of the single crystal formed connecting with the seed crystal is disturbed and becomes in an uneven state, a crystal having poor quality may be produced, and cracks may occur in the crystal.

Previously, even when the temperature of the central portion of the bottom of the crucible is low and, thereby, a melt flow which spreads in the radius direction, from the solid-liquid interface portion of the single crystal toward the inner surface of the side wall of the crucible, is not formed, the crystal is rotated when a single crystal is pulled up, so that the melt flow which spreads in the radius direction, from the single crystal toward the inner surface of the side wall of the crucible, can be formed. However, in the stage of forming a taper portion of the single crystal from the seed crystal, even when the crystal is rotated, since the diameters of the seed crystal and the taper portion of the single crystal are small, the centrifugal force generated by the rotation of the crystal is also small, so that a melt flow which spreads in the radius direction is weaker than that in the stage after the formation of the straight body portion of the single crystal is started. Therefore, it is difficult to flatten the solid-liquid interface portion of the single crystal only by the rotation of the crystal. Such a situation also occurs when only the wall-side heating member is disposed on the crucible as in the apparatus for producing a single crystal of the first embodiment.

On the other hand, in the apparatus for producing a single crystal of the present embodiment, as shown in FIG. 17, since the bottom-side heating member 65 is disposed on the crucible 1, the heating value at the central portion of the bottom 1b of the crucible 1, as well as the periphery of the bottom 1b. becomes higher than those of the other portions. Since the heating value at the central portion of the bottom 1b is increased, the temperature of the central portion of the bottom 1b of the crucible 1, as well as the periphery of the bottom 1b, becomes higher than those of the other portions. When the temperature of the central portion of the bottom 1b is increased as described above, a flow of the melt 25 is formed, while the flow rises in the vicinity of the center axis of the crucible 1 from the central portion of the bottom 1b along this center axis to reach the vicinity of the solid-liquid interface portion 59 of the seed crystal 13 and the single crystal 15, and spreads in the radius direction, from the vicinity of the solid-liquid interface portion 59 of the seed crystal 13 and the single crystal 15 toward the inner surface of the side wall 1a of the crucible 1.

In this manner, since the apparatus for producing a single crystal of the present embodiment is provided with the bottom-side heating member 65 for heating the central portion of the bottom 1b of the crucible 1, the central portion is also heated in addition to the periphery of the bottom 1b of the crucible 1 by driving the high-frequency generation device 49, as described above. Consequently, the flow of the melt 25 is formed, while the flow rises from the central portion of the bottom 1b of the crucible 1 to reach-the vicinity of the solid-liquid interface portion 59 of the seed crystal 13 and the single crystal 15, and spreads in the radius direction, from the vicinity of the solid-liquid interface portion 59 of the seed crystal 13 and the single crystal 15 toward the inner surface of the side wall 1a of the crucible 1. Therefore, the solid-liquid interface portion of the single crystal can be flattened regardless of conditions, such as the size and the shape of the crucible, the occurrence of defects, cracks, and the like can be reduced, and the fraction defective can be reduced in the production of the single crystal.

In the present embodiment, the ring-shaped members 47 serving as wall-side heating members are disposed. However, when any wall-side heating member is unnecessary depending on the conditions, e.g., the size and the shape of the crucible, the ring-shaped member 47 serving as a wall-side heating member may not be disposed in the configuration.

In the present embodiment, the bottom-side heating member 65 composed of the heat conducting member 61 made of the cylindrical or disk-shaped member and the disk-shaped heat generation portion 63 is included. However, the bottom-side heating member can have various configurations in which the heat is generated by the high-frequency generation device 49, and the central portion of the bottom 1b of the crucible 1 can be heated.

Figure 19:
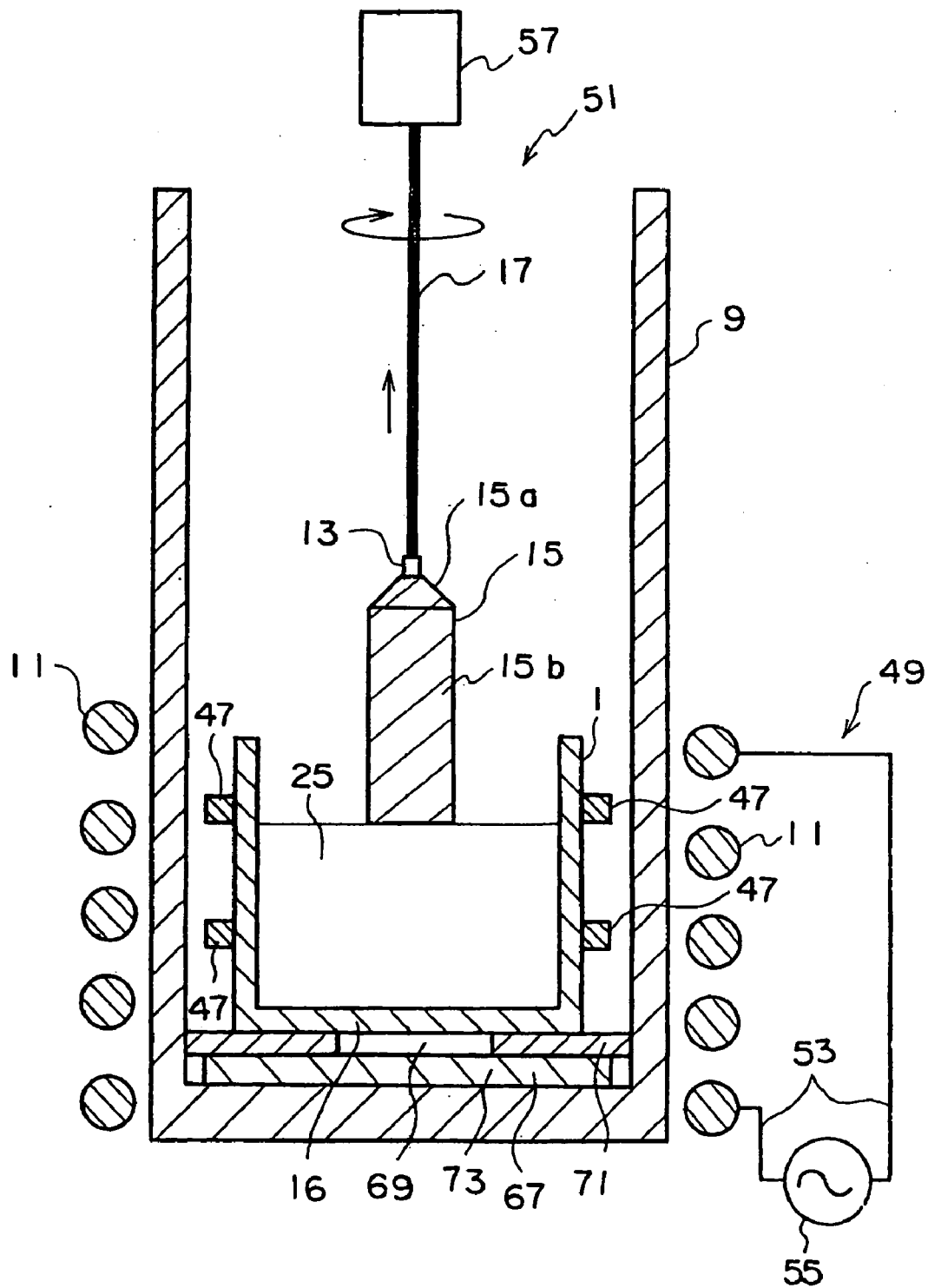
FIG. 19 is a sectional view showing a modified example of the seventh embodiment of the apparatus for producing a single crystal, according to the present invention.

For example, as shown in FIG. 19, a disk-shaped member made of electrically conductive, high-melting point metallic material is disposed on the bottom surface in a refractory 9 so as to serve as a heat generation portion 67, and a heat insulating member 71 having a through hole 69 in the central portion and having a diameter equal to the inner diameter of the refractory 9 is superposed on this heat generation portion 67. A crucible 1 is disposed on the heat insulating member 71 while the central portion of the bottom 1b of the crucible 1 is aligned with the through hole 69 of the heat insulating member 71. With respect to the above-described bottom-side heating member 73, the heat generated from the periphery of the heat generation portion 67 is concentrated on the central portion of the heat generation portion 67 by heat conduction, and the central portion of the bottom 1b of the crucible 1 is heated via the through hole 69 by radiation. In this manner, the bottom-side heating member can also be composed of the heat insulating member 71 constituting the heat conducting portion and the heat generation portion 67 which is a disk-shaped member, as in the bottom-side heating member 73. When the bottom-side heating member has a configuration as in the bottom-side heating member 73, the number of components can be reduced.

The bottom-side heating member can also have a configuration in which, for example, a heat generation portion is formed from an electrically conductive, high-melting point metallic material into the shape of a circular ring, a cylindrical heat conducting portion formed from an electrically conductive, high-melting point metallic material is disposed coaxially with this heat generation portion, and a rod-shaped connection member formed from a high-melting point metallic material is disposed in the shape of a spoke between the heat generation portion and the heat conducting portion. In bottom-side heating members having various configurations, the heat conducting portion is not necessarily in the shape of a disk or a cylinder, and can be made into the shape of a prism or the like.

Figure 20:
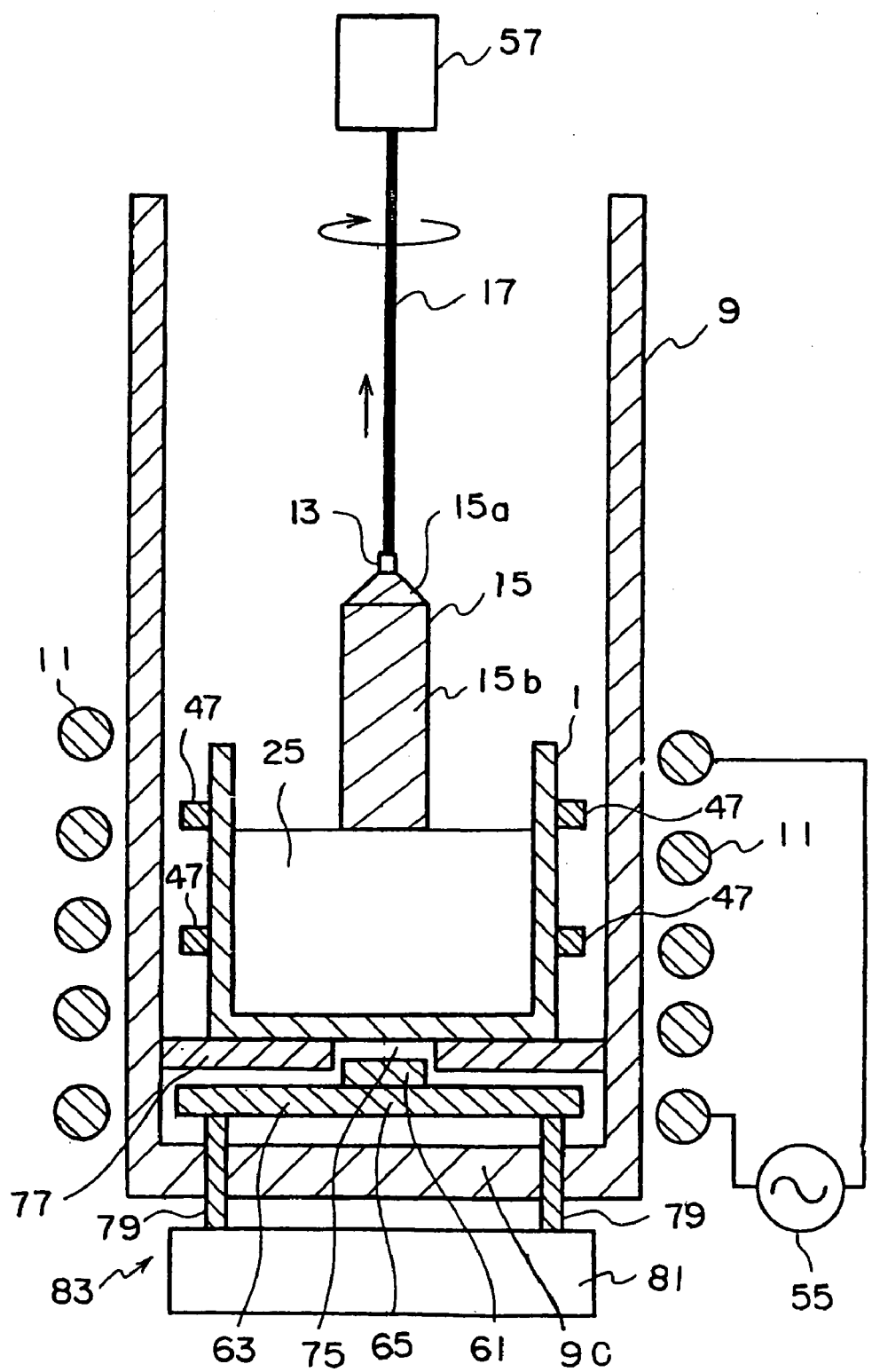
FIG. 20 is a sectional view showing another modified example of the seventh embodiment of the apparatus for producing a single crystal, according to the present invention.

In the sixth and seventh embodiments, the ring-shaped members 47 serving as wall-side heating members and the bottom-side heating member 65 are in the state of being fixed to the crucible 1. The wall-side heating member and the bottom-side heating member may be configured to be attachable and detachable at will, and be detached from the crucible when unnecessary, for example. Furthermore, a mechanism which allows the wall-side heating member and the bottom-side heating member to be attached to and detached from the crucible can also be disposed. For example, as shown in FIG. 20, a heat insulating member 77 having a through hole 75 in a central portion and having a diameter equal to the inner diameter of a refractory 9 is disposed above a bottom 9c in the refractory 9. A bottom-side heating member 65 which has the same configuration as in the seventh embodiment and which is formed separately from the crucible 1 is disposed between the bottom 9c in the refractory 9 and the heat insulating member 77. Here, connection members 79 disposed penetrating the bottom of the refractory 9 are connected to the lower surface of the heat generation portion 63 of the bottom-side heating member 65. The connection members 79 are connected to a driving mechanism 81, e.g., an oil hydraulic or air jack, a motor and rack-and-pinion type driving mechanism, or the like, for vertically transporting the bottom-side heating member 65, and the connection members 79 and the driving mechanism 81 constitute a heating member transporting device 83.

By adopting such a configuration provided with the heating member transporting device 83, a heat conducting portion 61 of the bottom-side heating member 65 can be detached from the bottom 1b of the crucible 1, if necessary, and therefore, the heating of the central portion of the bottom 1b can be stopped. In the stage of, for example, forming a taper portion 15a of a single crystal 15 from a seed crystal 13, the bottom-side heating member 65 is pushed up by the heating member transporting device 83 so as to bring the heat conducting portion 61 of the bottom-side heating member 65 into contact with the bottom 1b of the crucible 1, and when the diameter of the taper portion 15a of the seed crystal 15 becomes adequately increased, the bottom-side heating member 65 is moved downwards so as to prevent the heat of the bottom-side heating member 65 from being conducted to the central portion of the bottom 1b of the crucible 1. The configuration provided with such a heating member transporting device can also be applied to the wall-side heating member. By adopting the above-described configuration, the solid-liquid interface portion 59 of the seed crystal 15 can be controlled at an optimum state and, therefore, a single crystal having higher quality can be produced.

The technologies of producing a single crystal shown in the first to the seventh embodiments can be used appropriately in combinations.

The present invention is not limited to the production apparatuses having the configurations of the first to the seventh embodiments, but can be applied to apparatuses for producing a single crystal, the apparatus having various configurations in which crucibles are subjected to the high-frequency heating. Furthermore, apparatuses for producing a single crystal, according to the present invention, are particularly effective for forming a single crystal of oxide, e.g., gadolinium, gallium, garnet, cerium-activated gadolinium silicate, or the like, and in addition, can be used for producing other various types of single crystal.

The invention claimed is:

1. A method for producing a single crystal comprising the step of heating a crucible which holds a raw material and pulling up a seed crystal while the seed crystal is in contact with a melt of the raw material so as to produce a single crystal,
   wherein the crucible is heated by a high-frequency induction heater including a high-frequency coil for heating the crucible, and
   wherein the diameter of the single crystal is increased during formation of a taper portion of the single crystal in an initial stage of growth of the single crystal, and the single crystal is cylindrically grown connecting with the taper portion during formation of a straight body portion of the single crystal, while the radiation heat which reaches the taper portion of the single crystal from an inner surface of said crucible is blocked during the formation of the taper portion of the single crystal.

2. A method for producing a single crystal comprising the step of heating a portion in the side lower than the upper end portion of a crucible which holds a raw material of a single crystal and pulling up a seed crystal while the seed crystal is in contact with a melt of the raw material so as to produce a single crystal,
   wherein the crucible is heated by a high-frequency induction heater including a high-frequency coil for heating the crucible, and
   wherein the diameter of the single crystal is increased during formation of a taper portion of the single crystal in an initial stage of growth of the single crystal, and the single crystal is cylindrically grown connecting with the taper portion during formation of a straight body portion of the single crystal, while the radiation heat toward an upper portion above the upper end portion of said crucible is blocked during the formation of the straight body portion of the single crystal.

3. An apparatus for producing a single crystal comprising a crucible for holding a raw material, a high-frequency generation device including a high-frequency coil disposed surrounding said crucible, and a crystal transporting device for rotating and transporting a seed crystal upwards from the inside of said crucible,
   wherein the apparatus comprises a wall-side heating member for heating a portion in between the upper end portion and the lower end portion of the side wall of said crucible by the operation of said high-frequency generation device.

4. The apparatus for producing a single crystal, according to claim 3, wherein said wall-side heating member comprises a protrusion-shaped member which is made of an electrically conductive material and which is disposed in between the upper end portion and the lower end portion of the outer surface of the side wall of said crucible while being extended along the circumferential direction of the outer surface of the side wall of said crucible.

5. An apparatus for producing a single crystal comprising a crucible for holding a raw material, a high-frequency generation device including a high-frequency coil disposed surrounding said crucible, and a crystal transporting device for rotating and transporting a seed crystal upwards from the inside of said crucible,
   wherein the apparatus comprises a bottom-side heating member for heating a central portion of the bottom by the operation of said high-frequency generation device, on the bottom of said crucible.

6. The apparatus for producing a single crystal, according to claim 5, wherein said bottom-side heating member comprises a heat conducting portion made of a heat conductive material for conducting heat to a central portion of the outer surface of the bottom of said crucible and a board-shaped heat generation portion which has a diameter larger than the diameter of the heat conducting portion and which is made of an electrically conductive material.

7. The apparatus for producing a single crystal, according to claim 5, wherein said bottom-side heating member comprises a heat insulating member made of a heat insulating material having a through hole at the position in accordance with a central portion of the outer surface of the bottom of said crucible and a board-shaped heat generation portion which has a diameter larger than the diameter of the through hole of said heat insulating member and which is made of an electrically conductive material.

8. An apparatus for producing a single crystal comprising a crucible for holding a raw material, a heating device for heating the raw material in said crucible, and a crystal transporting device for transporting a seed crystal upwards from the inside of said crucible,
   wherein the heating device is a high-frequency induction heater including a high-frequency coil for heating the crucible, and
   wherein the apparatus further comprises a heat conducting member which extends upwards at least from the vicinity of the upper end portion of the side wall of said crucible, which surrounds a formed single crystal, and which is made of a material having heat conductivity.

9. An apparatus for producing a single crystal comprising a crucible for holding a raw material, a heating device for heating the raw material in said crucible, and a crystal transporting device for transporting a seed crystal upwards from the inside of said crucible,
wherein the heating device is a high-frequency induction heater including a high-frequency coil for heating the crucible, and
wherein the apparatus further comprises an interface portion radiation heat blocking member for blocking, at least during cooling after the formation of a single crystal, the radiation heat toward an upper portion above the interface portion between a taper portion, which is connected with a seed crystal of the formed single crystal and has a diameter gradually becoming increased, and a cylindrical straight body portion, which is connected with the taper portion of the formed single crystal.

10. The apparatus for producing a single crystal, according to claim 9, wherein the apparatus further comprises a heat conducting member which extends upward at least from the vicinity of the upper end portion of the side wall of said crucible, which surrounds a formed single crystal, and which is made of a material having heat conductivity.

11. The apparatus for producing a single crystal, according to claim 10, wherein the radiation heat blocking member is located at the upper end of the heat conducting member.

12. The apparatus for producing a single crystal, according to claim 9, further comprising a refractory member surrounding the crucible and extending above the crucible, and wherein the interface portion radiation heat blocking member is a lid portion of the refractory member.

13. An apparatus for producing a single crystal comprising a crucible for holding a raw material, a heating device for heating the raw material in said crucible, and a crystal transporting device for transporting a seed crystal upwards from the inside of said crucible,
wherein the heating device is a high-frequency induction heater including a high-frequency coil for heating the crucible, and
wherein the apparatus comprises an in-crucible radiation heat blocking member which surrounds a single crystal and which blocks the radiation heat from an inner surface of said crucible toward the single crystal positioned in the inside of said crucible and an in-crucible radiation heat blocking member transporting device for transporting said in-crucible radiation heat blocking member in a vertical direction, while said in-crucible radiation heat blocking member transporting device transports said in-crucible radiation heat blocking member to the position surrounding a taper portion of the single crystal during formation of the taper portion of the single crystal to increase the diameter of the single crystal in an initial stage of growth of the single crystal and transports said in-crucible radiation heat blocking member to the position at a distance from the single crystal during formation of a straight body portion of the single crystal cylindrically grown connecting with the taper portion.

14. The apparatus for producing a single crystal, according to claim 13, wherein the in-crucible radiation heat blocking member is a radiation heat shielding plate in a shape of a cone along the taper portion of the single crystal.

15. The apparatus for producing a single crystal, according to claim 14, wherein an angle of inclination of the conical surface of the radiation heat shielding plate is substantially equal to the angle of inclination of the taper surface of the taper portion of the single crystal.

16. An apparatus for producing a single crystal comprising a crucible for holding a raw material, a heating device for heating the raw material in said crucible, and a crystal transporting device for transporting a seed crystal upwards from the inside of said crucible,
wherein the heating device is a high-frequency induction heater including a high-frequency coil for heating the crucible, and
wherein the apparatus comprises a straight body portion radiation heat blocking member which can pass through a single crystal and which blocks the radiation heat toward an upper portion above the upper end portion of said crucible and a straight body portion radiation heat blocking member transporting device for transporting said straight body portion radiation heat blocking member in a vertical direction, while the heating device heats a portion in the side lower than the upper end portion of said crucible, and said straight body portion radiation heat blocking member transporting device transports said straight body portion radiation heat blocking member to the position at a distance from the upper end portion of said crucible during formation of a taper portion of the single crystal to increase the diameter of the single crystal in an initial stage of growth of the single crystal and positions said straight body portion radiation heat blocking member in between the outer perimeter surface of the straight body portion of the single crystal and the inner perimeter surface of said, crucible or in between the outer perimeter surface of the straight body portion of the single crystal and the upper end portion of said crucible during formation of the straight body portion of the single crystal cylindrically grown connecting with the taper portion.

* * * * *